(12) United States Patent
Saitoh et al.

(10) Patent No.: US 10,651,209 B2
(45) Date of Patent: May 12, 2020

(54) SEMICONDUCTOR DEVICE AND METHOD FOR MANUFACTURING SAME

(71) Applicant: Sharp Kabushiki Kaisha, Sakai, Osaka (JP)

(72) Inventors: Takao Saitoh, Sakai (JP); Yohsuke Kanzaki, Sakai (JP); Makoto Nakazawa, Sakai (JP); Kazuatsu Ito, Sakai (JP); Seiji Kaneko, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 137 days.

(21) Appl. No.: 16/072,910

(22) PCT Filed: Jan. 16, 2017

(86) PCT No.: PCT/JP2017/001252
§ 371 (c)(1),
(2) Date: Jul. 26, 2018

(87) PCT Pub. No.: WO2017/130776
PCT Pub. Date: Aug. 3, 2017

(65) Prior Publication Data
US 2019/0035824 A1 Jan. 31, 2019

(30) Foreign Application Priority Data
Jan. 27, 2016 (JP) .................. 2016-012982

(51) Int. Cl.
*H01L 27/12* (2006.01)
*H01L 29/45* (2006.01)
(Continued)

(52) U.S. Cl.
CPC ........ *H01L 27/1251* (2013.01); *G06F 3/0412* (2013.01); *H01L 21/76877* (2013.01);
(Continued)

(58) Field of Classification Search
CPC ............. H01L 27/1225; H01L 27/1259; H01L 27/124; H01L 27/127; H01L 29/7869;
(Continued)

(56) References Cited

U.S. PATENT DOCUMENTS

2012/0138922 A1 6/2012 Yamazaki et al.
2013/0320334 A1 12/2013 Yamazaki et al.
(Continued)

FOREIGN PATENT DOCUMENTS

JP 2010-003910 A 1/2010
JP 2012-134475 A 7/2012
(Continued)

*Primary Examiner* — Priyank J Shah
(74) *Attorney, Agent, or Firm* — Keating & Bennett, LLP

(57) ABSTRACT

A semiconductor device includes: a first thin film transistor (101) including a crystalline silicon semiconductor layer (13); and a second thin film transistor (102) including an oxide semiconductor layer (23). First source/drain electrodes (31), (33) of the first thin film transistor (101) are provided on the crystalline silicon semiconductor layer via a first interlevel dielectric layer (L1); a second source electrode (25S) of the second thin film transistor (102) is electrically connected to a line (35) which is made of the same conductive film as the first source/drain electrodes; the line (35) is provided on the second source electrode (25S) via a second interlevel dielectric layer (L2), and is in contact with the second source electrode (25S) within a second contact hole including an opening made in the second interlevel dielectric layer (L2); the second source electrode has a multilayer structure including a main layer (25m) and an upper layer (25u) disposed on the main layer such that, under the opening in the second interlevel dielectric layer, the upper layer (25u) has a first aperture and the main layer (25m) has a second aperture (p2) or recess, the second
(Continued)

aperture (p2) or recess being larger than the first aperture (p1) as viewed from the normal direction of the substrate.

20 Claims, 11 Drawing Sheets

(51) Int. Cl.
*H01L 29/66* (2006.01)
*G06F 3/041* (2006.01)
*H01L 21/768* (2006.01)
*H01L 29/786* (2006.01)
*G06F 3/044* (2006.01)

(52) U.S. Cl.
CPC .......... *H01L 27/124* (2013.01); *H01L 27/127* (2013.01); *H01L 27/1225* (2013.01); *H01L 27/1259* (2013.01); *H01L 29/45* (2013.01); *H01L 29/66969* (2013.01); *H01L 29/7869* (2013.01); *G06F 3/044* (2013.01); *G06F 2203/04103* (2013.01); *H01L 21/76805* (2013.01)

(58) Field of Classification Search
CPC ............. H01L 21/76805; G06F 3/0412; G06F 2203/04103
See application file for complete search history.

(56) References Cited

U.S. PATENT DOCUMENTS

2014/0286076 A1 9/2014 Aoki et al.
2016/0253030 A1 9/2016 Tada et al.

FOREIGN PATENT DOCUMENTS

| JP | 2014-007399 A | 1/2014 |
| JP | 2014-209727 A | 11/2014 |
| WO | 2015/059995 A1 | 4/2015 |

(a)

(b)

(a)

(b)

(c)

SEMICONDUCTOR DEVICE AND METHOD FOR MANUFACTURING SAME

TECHNICAL FIELD

The present invention relates to a semiconductor device and a method of producing the same.

BACKGROUND ART

An active matrix substrate includes a switching element for each pixel, e.g., a thin film transistor (hereinafter, "TFT"). In the present specification, such a TFT will be referred to as a "pixel TFT". As pixel TFTs, amorphous silicon TFTs whose active layer is an amorphous silicon film, and crystalline silicon TFTs whose active layer is a crystalline silicon film such as a polycrystalline silicon film, have been widely used.

In some cases, a part or a whole of a peripheral driving circuit may be integrally formed on the same substrate as the pixel TFTs. Such an active matrix substrate is referred to as a driver-monolithic active matrix substrate. In a driver-monolithic active matrix substrate, the peripheral driving circuit is to be provided in a region (a non-display region or a frame region) other than the region that contains a plurality of pixels (display region). The pixel TFTs and the TFTs composing the driving circuit (circuit TFTs) may be formed by using the same semiconductor film. As this semiconductor film, for example, a polycrystalline silicon film with a high field-effect mobility may be used.

Moreover, it has been proposed to use an oxide semiconductor as the material of the active layers of TFTs, instead of an amorphous silicon or a polycrystalline silicon. It has also been proposed to use, as an oxide semiconductor, an In—Ga—Zn—O type semiconductor whose main components are indium, gallium, zinc, and oxygen. These TFTs are called "oxide semiconductor TFTs". An oxide semiconductor provides a higher mobility than does an amorphous silicon. Therefore, oxide semiconductor TFTs can operate more rapidly than amorphous silicon TFTs. Moreover, an oxide semiconductor film is formed through a simple process as compared to a polycrystalline silicon film, and therefore is applicable to devices which require a large geometric area. Therefore, by using an oxide semiconductor film, it also becomes possible to form pixel TFTs and circuit TFTs integrally on the same substrate.

However, regardless of whether a polycrystalline silicon film or an oxide semiconductor film is used, it is difficult to adequately satisfy the characteristics that are required of both pixel TFTs and circuit TFTs.

On the other hand, Patent Document 1 discloses an active-matrix type liquid crystal panel including oxide semiconductor TFTs as the pixel TFTs and TFTs whose active layers are a non-oxide semiconductor film (e.g., crystalline silicon TFTs) as the circuit TFTs. In the semiconductor device disclosed in Patent Document 1, the source and drain electrodes of the crystalline silicon TFTs and the oxide semiconductor TFTs are formed by using the same conductive film as the source bus lines, with a protective dielectric film being formed so as to cover over these electrodes.

On the other hand, when an active matrix substrate is adopted in a display device having a touch sensor function (hereinafter an "in-cell touch-screen type display device"), detection electrodes of the touch sensors may be provided on the active matrix substrate (e.g. Patent Document 2).

CITATION LIST

Patent Literature

[Patent Document 1] Japanese Laid-Open Patent Publication No. 2010-3910
[Patent Document 2] International Publication No. 2015/059995

SUMMARY OF INVENTION

Technical Problem

The active matrix substrate disclosed in Patent Document 1 has a problem in that large parasitic capacitances may exist between the source bus lines and the gate bus lines.

Moreover, in an in-cell touch-screen type display device, for example, driving lines for driving touch sensors are formed on the active matrix substrate. In other words, a wiring layer(s) needs to be separately formed on the substrate from the gate electrodes and source and drain electrodes of the oxide semiconductor TFTs. This makes it difficult for the construction of the active matrix substrate disclosed in Patent Document 1 to be applied straightforwardly to an in-cell touch-screen type display device.

Accordingly, the inventors have sought for constructions that can reduce parasitic capacitances and yet are applicable to e.g. in-cell touch-screen type display devices. However, they have found that such an active matrix substrate will have difficulties in forming, through a simple process, any contact portion at which to connect an oxide semiconductor TFT or a crystalline silicon TFT to predetermined lines. This will be detailed later.

An embodiment of the present invention has been made in view of the above circumstances, and provides a semiconductor device having oxide semiconductor TFTs and crystalline silicon TFTs on the same substrate and excelling in contact characteristics.

Solution to Problem

A semiconductor device according to an embodiment of the present invention is a semiconductor device comprising: a substrate; and a first thin film transistor and a second thin film transistor supported on the substrate, wherein, the first thin film transistor includes a first gate electrode, a crystalline silicon semiconductor layer, a first gate dielectric layer interposed between the first gate electrode and the crystalline silicon semiconductor layer, and a first source electrode and a first drain electrode electrically connected to the crystalline silicon semiconductor layer; the second thin film transistor includes a second gate electrode, an oxide semiconductor layer, a second gate dielectric layer interposed between the second gate electrode and the oxide semiconductor layer, and a second source electrode and a second drain electrode electrically connected to the oxide semiconductor layer; the first source electrode and the first drain electrode are provided on the crystalline silicon semiconductor layer via a first interlevel dielectric layer, and are in contact with the crystalline silicon semiconductor layer respectively within a first source contact hole and a first drain contact hole made in the first interlevel dielectric layer; the second source electrode is electrically connected to a line which is made of a same conductive film as the first source electrode and the first drain electrode; the line is provided on the second source electrode via a second interlevel dielectric layer, and is in contact with the second source electrode within a second contact hole, the second contact hole including an opening made in the second interlevel dielectric layer; and the second source electrode has a multilayer structure including a main layer and an upper layer disposed on the main layer, wherein under the opening in the second interlevel dielectric layer the upper layer has a first aperture and the main layer has a second aperture or a recess, the second aperture or recess being larger than the first aperture as viewed from a normal direction of the substrate.

In an embodiment, a side face of the second aperture or recess of the main layer is not in contact with the line.

In an embodiment, the line is in contact with a side face of the first aperture of the upper layer.

An embodiment further includes a conductive layer made of the conductive film, the conductive layer being located in the second aperture or recess and being electrically isolated from the line.

In an embodiment, the main layer has the recess, such that at least a portion of a bottom face of the recess is exposed through the first aperture of the upper layer; and the line is in contact with the bottom face of the recess within the second contact hole.

In an embodiment, the second source electrode further includes a lower layer located on the substrate side of the main layer; the main layer has the second aperture, such that a portion of the lower layer is exposed through the second aperture; and the line is in contact with the exposed portion of the lower layer within the second contact hole.

In an embodiment, a side face of the first aperture of the upper layer is not in contact with the line.

In an embodiment, the upper layer is made of a material having a smaller etching rate with respect to hydrofluoric acid than that of the main layer.

In an embodiment, the main layer contains Al or Cu.

In an embodiment, the upper layer contains Ti or Mo.

In an embodiment, the first thin film transistor has a top gate structure, and the second thin film transistor has a bottom gate structure, the first gate electrode and the second gate electrode being provided in same layer; and the first interlevel dielectric layer includes the first gate dielectric layer, the second gate dielectric layer, and the second interlevel dielectric layer.

In an embodiment, the oxide semiconductor layer comprises an In—Ga—Zn—O based semiconductor. The In—Ga—Zn—O based semiconductor may include a crystalline portion.

In an embodiment, the oxide semiconductor layer has a multilayer structure.

In an embodiment, the second thin film transistor is of a channel-etch type.

A method of producing a semiconductor device according to an embodiment of the present invention is a method of producing a semiconductor device including, on a substrate: a first thin film transistor having an active layer which is a crystalline silicon semiconductor layer; and a second thin film transistor having an active layer which is an oxide semiconductor layer, the first thin film transistor being disposed in a first TFT forming region and the second thin film transistor being disposed in a second TFT forming region, the method comprising: (A) a step of providing a substrate, including: in the first TFT forming region, the crystalline silicon semiconductor layer and a first interlevel dielectric layer covering the crystalline silicon semiconductor layer; and, in the second TFT forming region, a source electrode and a drain electrode of the second thin film transistor, and a second interlevel dielectric layer covering the source electrode and the drain electrode, the source electrode and the drain electrode having a multilayer structure including a main layer and an upper layer on the main layer, the upper layer having a smaller etching rate with respect to hydrofluoric acid than that of the main layer; (B) a step of making a first source contact hole and a first drain contact hole in the first interlevel dielectric layer, the first source contact hole and the first drain contact hole reaching the crystalline silicon semiconductor layer, and an opening in the second interlevel dielectric layer, the opening reaching the source electrode; (C) a step of cleaning a surface of the crystalline silicon semiconductor layer exposed through the first source contact hole and the first drain contact hole with a cleaning agent containing hydrofluoric acid, wherein, as a result of the upper layer and the main layer of the source electrode being etched with the cleaning agent, under the opening in the second interlevel dielectric layer, a first aperture is made in the upper layer and a second aperture or a recess is made in the main layer, thus forming a second contact hole which includes the opening, the first aperture, and the second aperture or recess; and (D) a step of forming, on the second interlevel dielectric layer and in the second contact hole, a line which is in contact with the source electrode within the second contact hole.

In an embodiment, as viewed from the normal direction of the substrate, the second aperture or recess is larger than the first aperture.

In an embodiment, the oxide semiconductor layer comprises an In—Ga—Zn—O based semiconductor. The In—Ga—Zn—O based semiconductor may include a crystalline portion.

In an embodiment, the oxide semiconductor layer has a multilayer structure.

In an embodiment, the second thin film transistor has a channel-etch structure.

An embodiment further includes a driving line for an in-cell touch-screen panel, the driving line for an in-cell touch-screen panel being made of a same conductor film as the line.

An in-cell touch-screen type display device according to an embodiment of the present invention comprises any of the above semiconductor devices.

Advantageous Effects of Invention

According to an embodiment of the present invention, a semiconductor device having oxide semiconductor TFTs and crystalline silicon TFTs on the same substrate and excelling in contact characteristics can be realized.

DESCRIPTION OF EMBODIMENTS

As described above, the inventors have sought for an active matrix substrate construction which has crystalline silicon TFTs and oxide semiconductor TFTs on the same substrate and which is applicable even to an in-cell touch-screen type display device, for example. As a result, they have arrived at a structure in which, on an insulative protection film covering the oxide semiconductor TFTs, a wiring layer is formed by using a conductive film that is different from the source and drain electrodes of the oxide semiconductor TFTs. By providing source bus lines in this wiring layer, parasitic capacitances between the source bus lines and the gate bus lines can be reduced. Furthermore, by forming the source and drain electrodes of the crystalline silicon TFTs in this wiring layer, the number of steps for forming contact holes may be reduced in some cases.

However, it has been found that it may be impossible with the above structure to attain good contact characteristics in both of: a contact portion (first contact portion) that connects a crystalline silicon semiconductor layer with source and drain electrodes within the wiring layer; and a contact portion (second contact portion) that connects a source electrode of an oxide semiconductor TFT with a source line within the wiring layer.

Hereinafter, with reference to the drawings, a method of producing a semiconductor device (a semiconductor device of Reference Example) having the above structure and problems thereof will be described.

Figure 11:
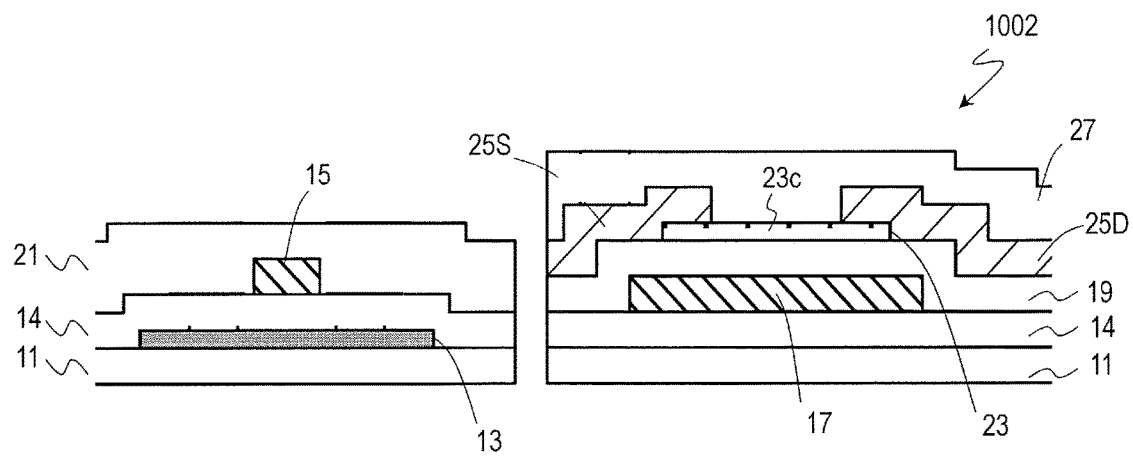
FIG. 11 (*a*) through (*c*) are step-by-step cross-sectional views showing a process according to Reference Example of forming an oxide semiconductor TFT and a crystalline silicon TFT on the same substrate.
Figure 11:
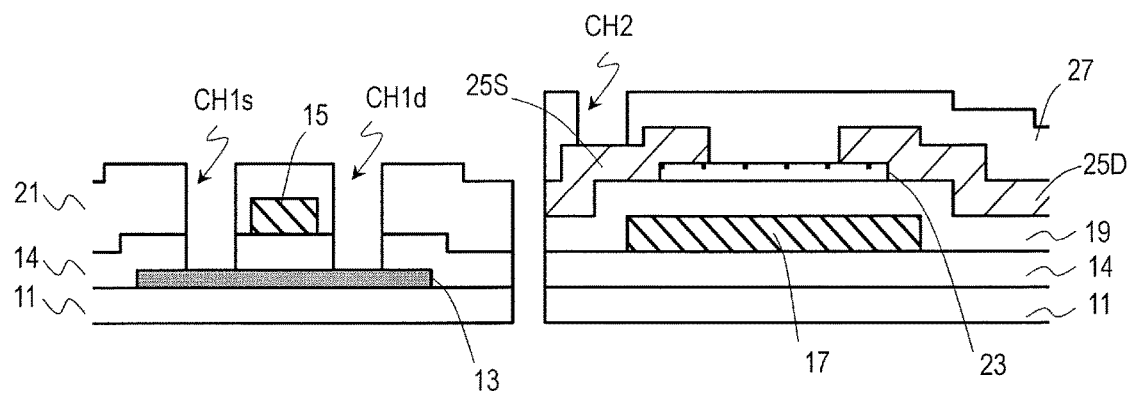
Figure 11:
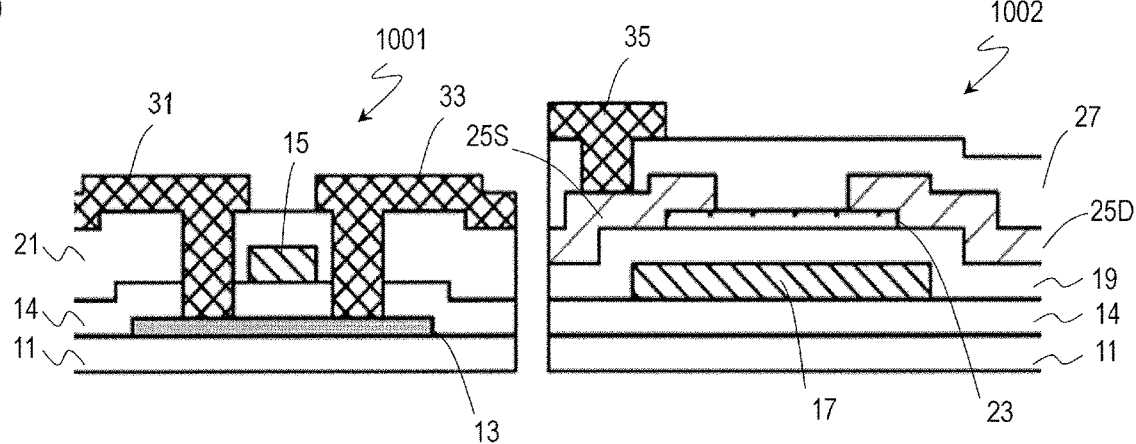

FIGS. 11(*a*) through (*c*) are step-by-step cross-sectional views showing a process according to Reference Example of forming oxide semiconductor TFTs and crystalline silicon TFTs on the same substrate. Herein, a method of forming a crystalline silicon semiconductor TFT 1001 of top gate structure and a top-contact type oxide semiconductor TFT 1002 of bottom gate structure on a substrate 11 will be illustrated as an example.

First, as shown in FIG. 11(*a*), in a region (first TFT forming region) of the substrate 11 where the crystalline silicon TFT 1001 is to be formed, a crystalline silicon semiconductor layer 13, a first dielectric layer 14 covering the crystalline silicon semiconductor layer 13, a first gate electrode 15 disposed on the first dielectric layer 14, and a dielectric layer 21 covering the first gate electrode 15 are formed.

In a region (second TFT forming region) of the substrate 11 where the oxide semiconductor TFT 1002 is to be formed, the oxide semiconductor TFT 1002 is formed, which includes: a second gate electrode 17, a second dielectric layer 19 covering the second gate electrode 17, an oxide semiconductor layer 23 disposed on the second dielectric layer 19, and a second source electrode 25S and a second drain electrode 25D which are in contact with the oxide semiconductor layer 23. A third dielectric layer 27 is formed on the oxide semiconductor TFT 1002.

Next, by using a resist mask(s) not shown, the dielectric layers 14, 21 and 27 are etched. As a result, as shown in FIG. 11(*b*), in the first TFT forming region, a first source contact hole CH1*s* and a first drain contact hole CH1*d* (which may be collectively referred to as the "first contact holes CH1") are formed in the dielectric layers 14 and 21, such that portions of the crystalline silicon semiconductor layer 13 are exposed through the first source contact hole CH1*s* and the first drain contact hole CH1*d*; and, in the second TFT forming region, a second contact hole CH2 is formed in the third dielectric layer 27, through which a portion of the second source electrode 25S is exposed.

Thereafter, as shown in FIG. 11(*c*), by using the same conductive film, a first source electrode 31 and a first drain electrode 33 of the crystalline silicon TFT 1001 and a line 35 of the oxide semiconductor TFT 1002 are formed. The first source electrode 31 and the first drain electrode 33 are in contact with the crystalline silicon semiconductor layer 13 within, respectively, the first source contact hole CH1*s* and the first drain contact hole CH1*d*. The line 35 is in contact with the oxide semiconductor layer 23 within the second contact hole CH2. In this manner, the semiconductor device is obtained.

In the present specification, connecting portions between the first source electrode 31 and first drain electrode 33 and the crystalline silicon semiconductor layer 13 within the first contact holes CH1 are referred to as the "first contact portions", whereas the connecting portion between the line 35 and the source electrode 25S within the second contact hole CH2 is referred to as the "second contact portion".

In the above method, for the purpose of reducing the contact resistance between the first source electrode 31 and first drain electrode 33 and the crystalline silicon semiconductor layer 13, in the step shown in FIG. 11(*b*), the surface of the crystalline silicon as exposed through the first contact holes CH1 may be cleaned with hydrofluoric acid (HF solution). At this time, the second source electrode 25S (which typically is a metal electrode) as exposed through the second contact hole CH2 will also be subjected to the HF solution at the same time, whereby the second source electrode 25S may become etched.

Figure 12:
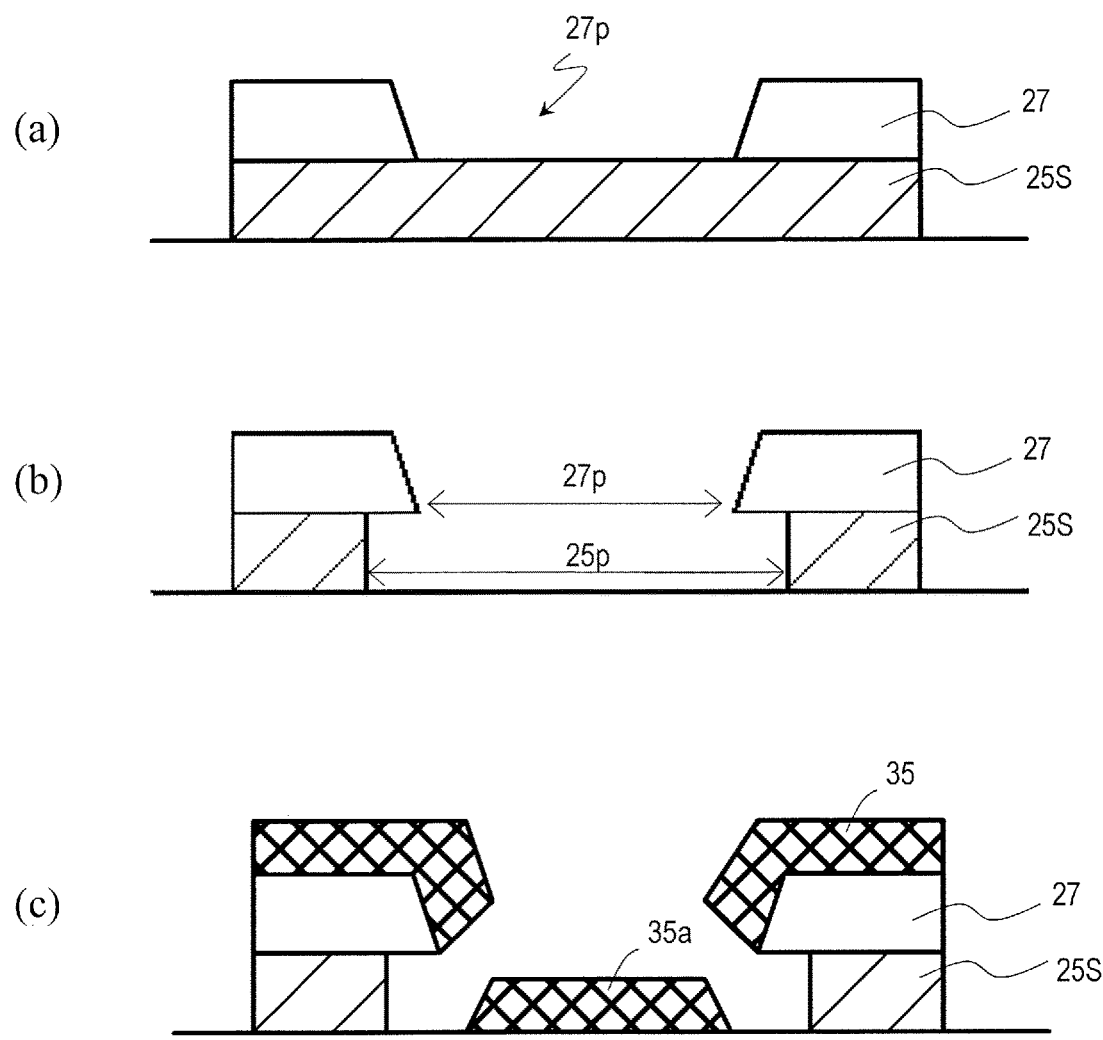
FIG. 12 (*a*) through (*c*) are enlarged cross-sectional views showing a method of forming of the second contact portion in Reference Example.

FIGS. 12(*a*) through (*c*) are step-by-step cross-sectional views for describing a method of producing the semiconductor device of Reference Example in the case where a cleaning step is performed, showing enlarged the second contact portion. FIG. 12(*a*) corresponds to the step shown in FIG. 11(*b*).

As shown in FIG. 12(*a*), an opening 27*p* is made in the third dielectric layer 27, through which to expose a portion of the second source electrode 25S. Next, as described above, an HF solution is used to clean the crystalline silicon that is exposed in the first contact holes CH1. At this time, the second source electrode 25S exposed in the opening 27p is also subjected to the HF solution. As a result, as shown in e.g. FIG. 12(b), an aperture 25p is created in the second source electrode 25S. When the second source electrode 25S is e.g. a metal electrode such as Al or Cu, the aperture 25p may be larger than the opening 27p in the third dielectric layer 27 as viewed from the normal direction of the substrate. Even if a conductive film from which to make the line 35 is formed in this state, it will be difficult to place the conductive film in contact with the second source electrode 25S, as illustrated in FIG. 12(c). In this example, the line 35 is disposed on the third dielectric layer 27 and on side faces of the third dielectric layer 27, without being in contact with the second source electrode 25S. A portion 35a of the conductive film may be situated in the aperture of the second source electrode 25S, in a manner isolated from the line 35.

Thus, if a cleaning step using an HF solution is conducted, good contact between the second source electrode 25S and the line 35 cannot be achieved, in the second contact portion. On the other hand, if a cleaning step using an HF solution is not performed, there will be high contact resistance between the crystalline silicon semiconductor layer 13 and the first source electrode 31 and first drain electrode 33, in the first contact portion. Thus, it is difficult to attain good contact characteristics in both of the first contact portion and the second contact portion.

In answer thereto, the inventors have found a construction which provides good contact characteristics even if the second source electrode 25S is etched through a cleaning step or the like, thereby arriving at the present invention.

In the present specification, a "crystalline silicon TFT" refers to a TFT which includes an active region (i.e., a region in which a channel is formed) that mainly contains crystalline silicon, including for example crystalline silicon TFTs, single-crystalline silicon TFTs, and so on. An "oxide semiconductor TFT" refers to a TFT which includes an active region that mainly contains an oxide semiconductor. A semiconductor device of according to an embodiment of the present invention may at least include crystalline oxide semiconductor TFTs and crystalline silicon TFTs which are formed on the same substrate, and broadly encompasses circuit boards, e.g., active matrix substrates, various display devices, e.g., liquid crystal display devices and organic EL display devices, image sensors, electronic appliances, and the like.

First Embodiment

Hereinafter, with reference to the drawings, a semiconductor device according to the first embodiment will be described.

The semiconductor device according to the present embodiment is similar in construction to the semiconductor device of Reference Example which has been described with reference to FIG. 11(c). The differences, however, are the structure of the second source electrode 25S and the structure of the second contact portion.

Figure 1:
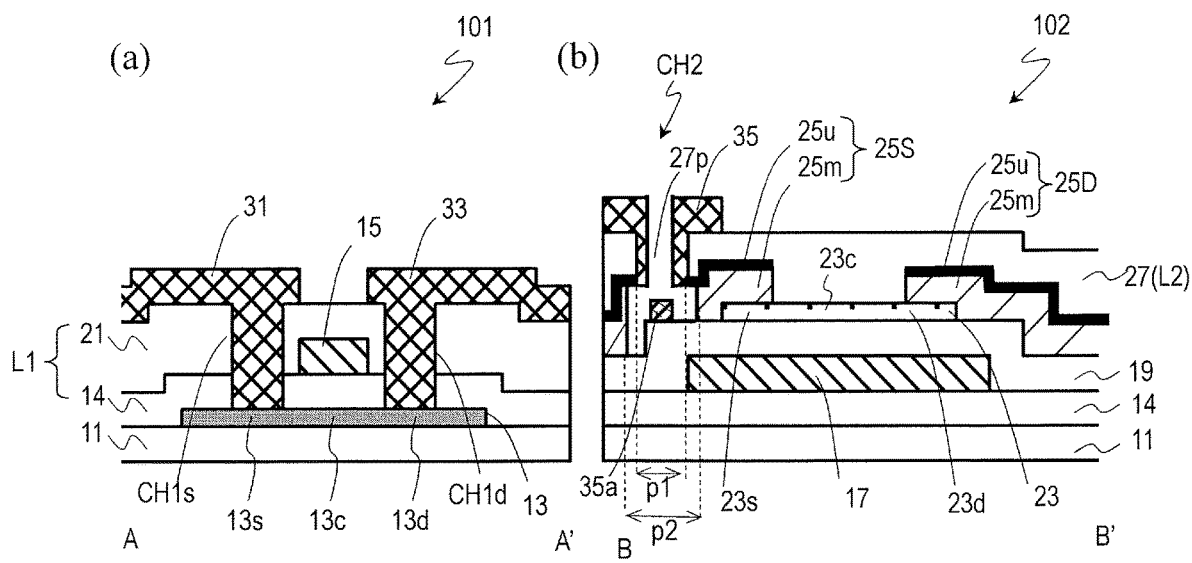
FIGS. 1 (a) and (b) are cross-sectional views of a crystalline silicon TFT 101 and an oxide semiconductor TFT 102, respectively, of a semiconductor device according to a first embodiment; (c) and (d) are plan views of the crystalline silicon TFT 101 and the oxide semiconductor TFT 102, respectively.
Figure 1:
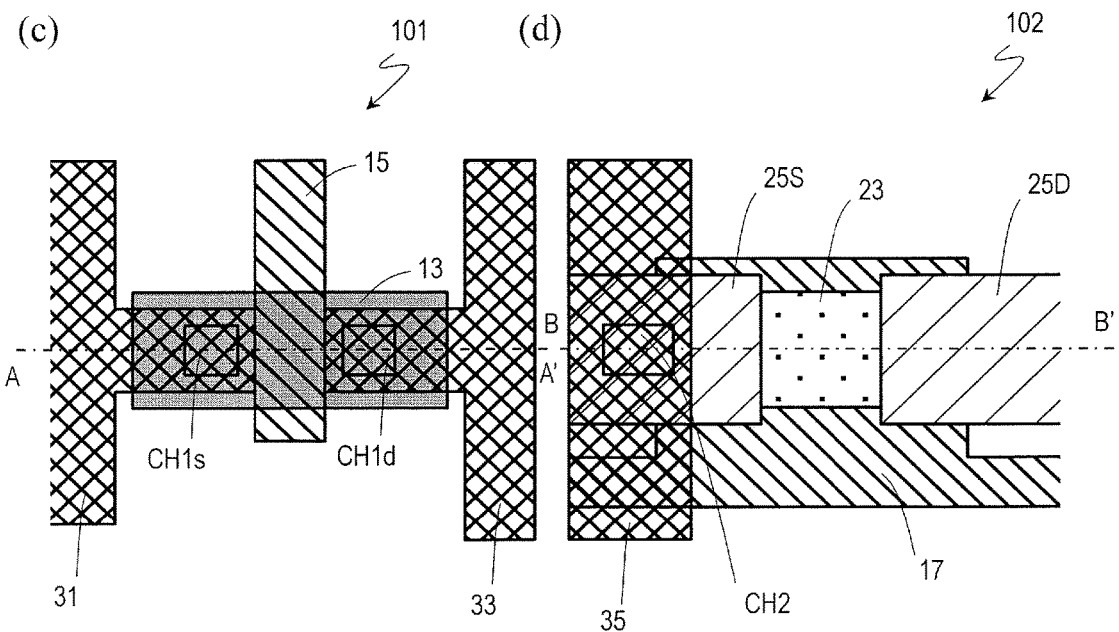

FIGS. 1(a) and (b) are cross-sectional views of a crystalline silicon TFT 101 and an oxide semiconductor TFT 102, respectively, of the semiconductor device according to the present embodiment; FIGS. 1(c) and (d) are plan views of FIGS. 1(a) and (b), respectively. In FIG. 1, constituent elements similar to those of the semiconductor device of Reference Example (FIG. 11) are denoted by identical reference numerals.

The semiconductor device according to the present embodiment includes a substrate 11 and a crystalline silicon TFT 101 (also referred to as the "first thin film transistor") and an oxide semiconductor TFT 102 (also referred to as the "second thin film transistor") supported on the substrate 11.

As shown in FIGS. 1(a) and (c), the crystalline silicon TFT 101 includes: a crystalline silicon semiconductor layer 13; a first gate electrode 15 disposed so as to overlap at least a portion of the crystalline silicon semiconductor layer 13 via the first dielectric layer 14; and a first source electrode 31 and a first drain electrode 33 electrically connected to the crystalline silicon semiconductor layer 13. The first source electrode 31 and first drain electrode 33 are provided on the crystalline silicon semiconductor layer 13 via a first interlevel dielectric layer L1. The crystalline silicon semiconductor layer 13 includes a channel region 13c and a source region 13s and a drain region 13d respectively disposed on opposite sides of the channel region 13c.

The crystalline silicon TFT 101 may have a top gate structure. In this case, the first dielectric layer 14 is formed so as to cover the crystalline silicon semiconductor layer 13, while the first gate electrode 15 is disposed on the first dielectric layer 14. The first gate electrode 15 is disposed so as to overlap the channel region 13c of the crystalline silicon semiconductor layer 13 via the first dielectric layer 14. The crystalline silicon semiconductor layer 13 and the first gate electrode 15 are covered with a dielectric layer 21.

In the first dielectric layer 14 and the dielectric layer 21, a first source contact hole CH1s and a first drain contact hole CH1d reaching the crystalline silicon semiconductor layer 13 are formed. The first source electrode 31 is disposed on the dielectric layer 21 and in the first source contact hole CH1s, and is in contact with the crystalline silicon semiconductor layer 13 within the first source contact hole CH1s. The first drain electrode 33 is disposed on the dielectric layer 21 and in the first drain contact hole CH1d, and is in contact with the crystalline silicon semiconductor layer 13 within the first drain contact hole CH1d. In the present specification, any dielectric layer which is located between the crystalline silicon semiconductor layer 13 and the first source electrode 31 and first drain electrode 33 and in which the first contact holes CH1 are formed (which herein are the first dielectric layer 14 and the dielectric layer 21) is referred to as the "first interlevel dielectric layer L1".

As shown in FIGS. 1(b) and (d), the oxide semiconductor TFT 102 includes: an oxide semiconductor layer 23; a second gate electrode 17 which is disposed so as to overlap at least a portion of the oxide semiconductor layer 23 via a second dielectric layer 19; and a second source electrode 25S and a second drain electrode 25D electrically connected to the oxide semiconductor layer 23.

The second source electrode 25S has a multilayer structure including a main layer 25m and an upper layer 25u disposed on the main layer 25m. The second drain electrode 25D may also have a similar multilayer structure. The materials of the upper layer 25u and the main layer 25m are selected so that the etching rate of the upper layer 25u with respect to an HF solution is smaller than that of the main layer 25m. The main layer 25m may contain e.g. Al or Cu. The upper layer 25u may contain e.g. Ti or Mo. The main layer 25m may be made of a material which is lower in electrical resistance than is the upper layer 25u, and be thicker than the upper layer 25u.

The oxide semiconductor TFT 102 may have a bottom gate structure. In this example, the second gate electrode 17 is formed on the first dielectric layer 14. The second gate electrode 17 is covered by the second dielectric layer 19, such that the oxide semiconductor layer 23 is formed on the second dielectric layer 19. The second source electrode 25S and the second drain electrode 25D may each be disposed in contact with the upper face of the oxide semiconductor layer 23. The region of the oxide semiconductor layer 23 that is in contact with the second source electrode 25S is referred to as a source contact region 23s, and the region thereof that is in contact with the second drain electrode 25D is referred to as a drain contact region 23d. The oxide semiconductor layer 23 and the second source electrode 25S and the second drain electrode 25D are covered by a third dielectric layer 27.

In the second contact portion, the second source electrode 25S is electrically connected to a line (which herein is a source bus line) 35 that is made of the same conductive film as the first source electrode 31 and first drain electrode 33 of the crystalline silicon TFT 101. The line 35 is provided on the second source electrode 25S via the third dielectric layer 27, and, in the second contact portion, is directly in contact with the second source electrode 25S within a second contact hole CH2 formed in the third dielectric layer 27, the second contact hole CH2 having an opening 27p. In the present specification, the dielectric layer (herein the third dielectric layer 27) which is located between the oxide semiconductor layer 23 and the line 35 and in which the second contact hole CH2 is made is referred to as the "second interlevel dielectric layer L2".

In this example, under the opening 27p which is made in the third dielectric layer 27, the upper layer 25u of the source electrode 25S has a first aperture p1 and the main layer 25m has a second aperture p2. Thus, the second contact hole CH2 consists of the opening 27p, the first aperture p1 in the upper layer 25u of the source electrode 25S, and the second aperture p2 in the main layer 25m. As viewed from the normal direction of the substrate 11, the second aperture p2 is larger than the first aperture p1. Within the second contact hole CH2, the line 35 is in contact with the side face of the upper layer 25u, for example. As a result of this, the second source electrode 25S and the line 35 are connected. In the second aperture p2, a conductive layer 35a which is isolated from the line 35 may be disposed.

Now, the structure of and the method of forming the second contact portion according to the present embodiment will be described.

Figure 2:
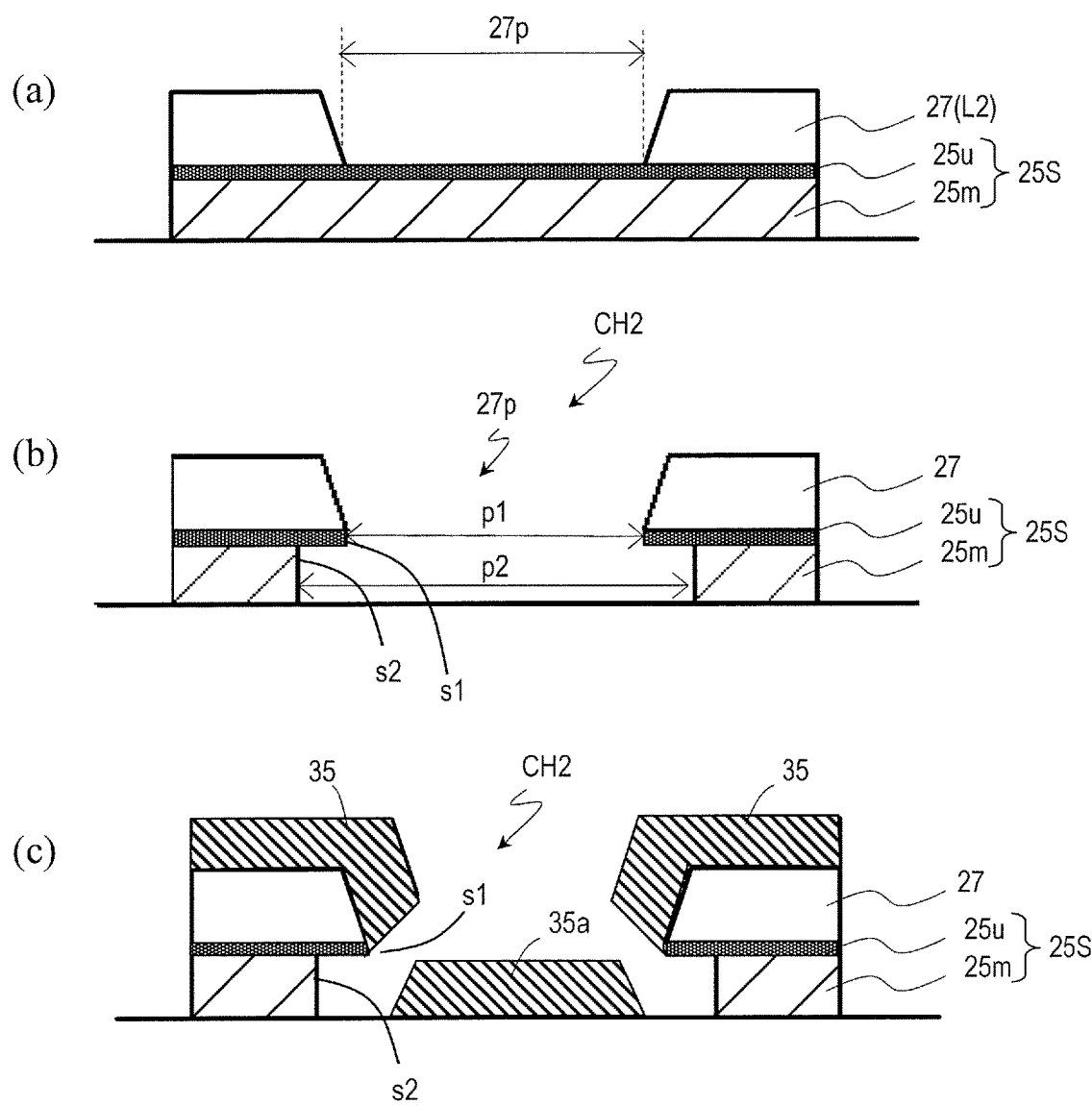
FIG. 2 each of (a) through (c) is a schematic enlarged cross-sectional view for describing a method of forming a second contact portion of the semiconductor device according to the first embodiment.
Figure 3:
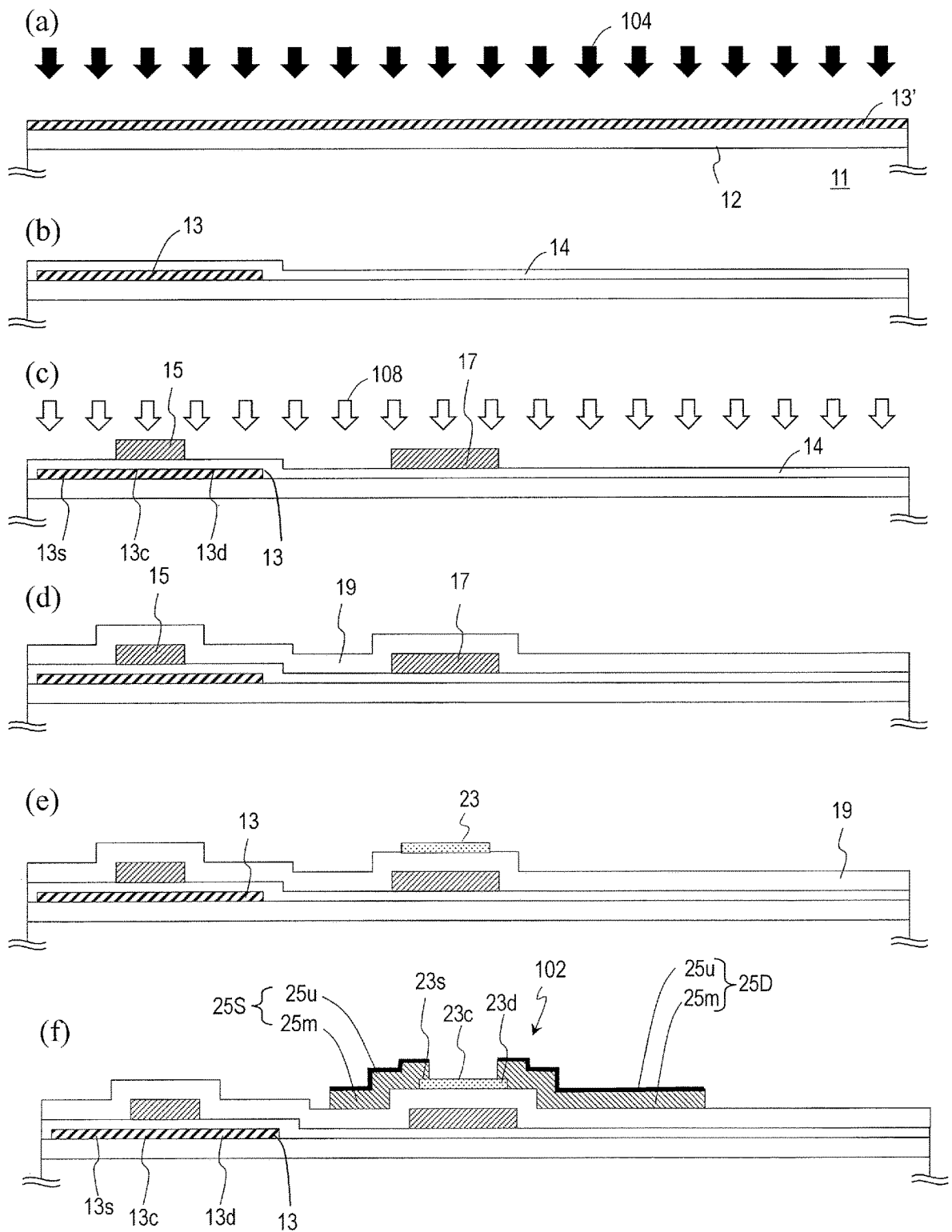
FIG. 3 (a) through (f) are step-by-step cross-sectional views for describing a method of producing the crystalline silicon TFT 101 and the oxide semiconductor TFT 102 according to the first embodiment.
Figure 4:
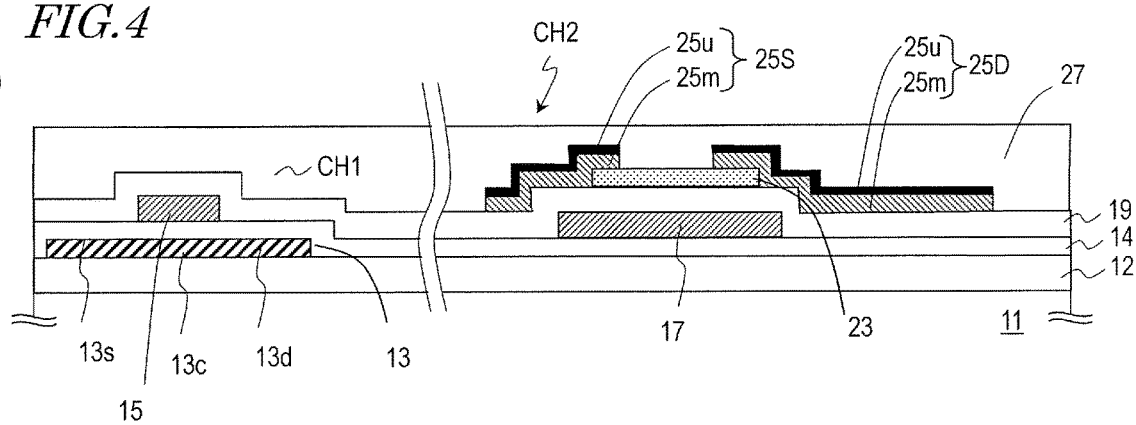
FIG. 4 (a) through (d) are step-by-step cross-sectional views for describing a method of producing the crystalline silicon TFT 101 and the oxide semiconductor TFT 102 according to the first embodiment.
Figure 4:
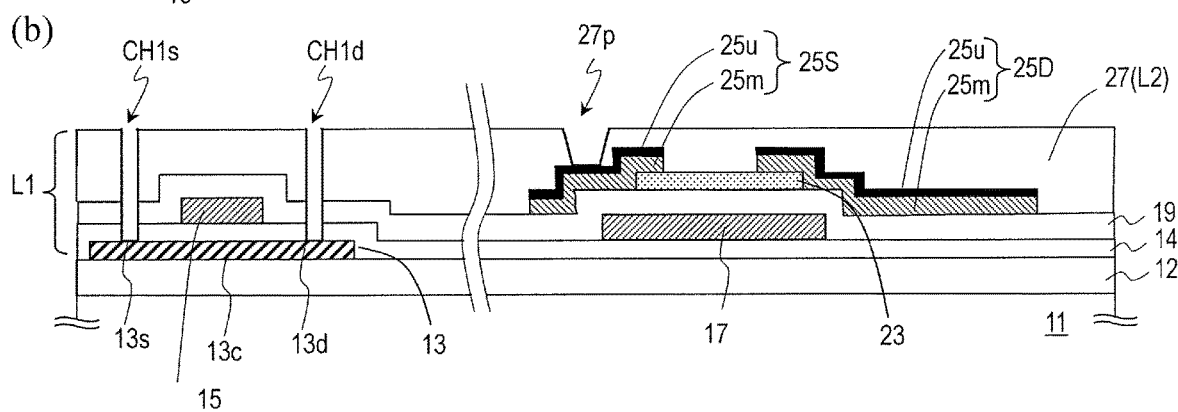
Figure 4:
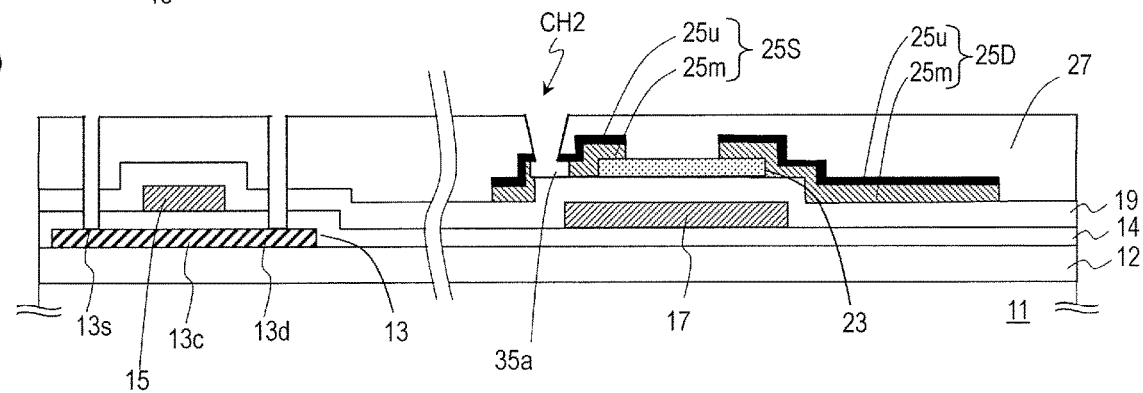
Figure 4:
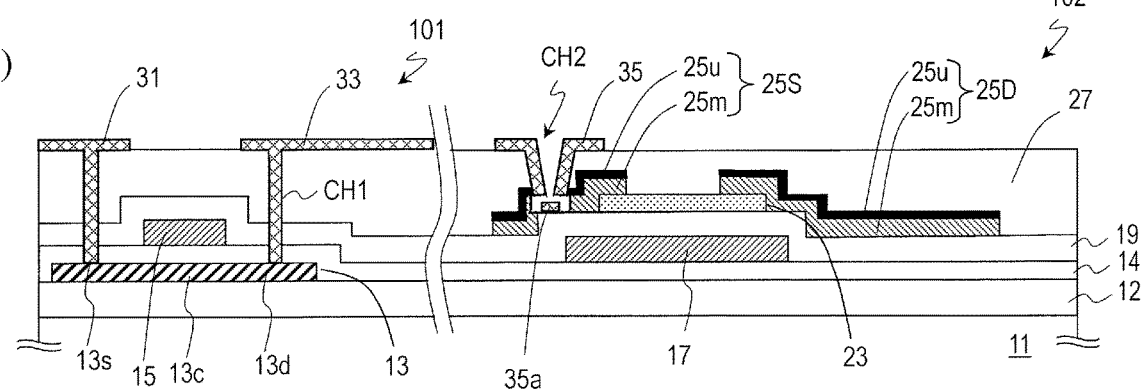

FIGS. 2(a) through (c) are schematic enlarged cross-sectional views showing a method of forming the second contact portion. In FIG. 2, constituent elements similar to those of the semiconductor device of Reference Example in FIG. 12 are denoted by identical reference numerals.

First, as shown in FIG. 2(a), the second source electrode 25Sf of the oxide semiconductor TFT is formed so as to be in contact with an oxide semiconductor layer (not shown) that is formed on a substrate. The second source electrode 25S has a multilayer structure including the main layer (e.g. an Al layer) 25m and the upper layer (e.g. a Ti layer) 25u disposed on the main layer 25m.

Next, the third dielectric layer 27 is formed so as to cover the source electrode 25S, and the opening 27p is made in the third dielectric layer 27. The opening 27p is formed simultaneously with the first contact holes (not shown) in the crystalline silicon TFT.

Thereafter, with an HF solution, the crystalline silicon which is exposed through the first contact holes is cleaned. In this step, the source electrode 25S exposed through the opening 27p in the third dielectric layer 27 is also subjected to the HF solution. As a result, as shown in FIG. 2(b), the upper layer 25u and the main layer 25m of the source electrode 25S become etched, whereby the first aperture p1 is created in the upper layer 25u and the second aperture p2 is created in the main layer 25m. The apertures p1 and p2 are formed in positions overlapping the opening 27p as viewed from the normal direction of the substrate. In this manner, the opening 27p in the third dielectric layer 27, the second contact hole CH2, consisting of the first aperture p1 in the upper layer 25u of the source electrode 25S and the second aperture p2 in the main layer 25m, is obtained.

Note that the cleaning agent is not limited to an HF solution. As the cleaning agent, a solution containing hydrofluoric acid can be used. For example, buffered hydrogen fluoride (BHF), which is a mixed solution of hydrofluoric acid and an ammonium fluoride solution, may be used.

In the second contact hole CH2, due to a difference in etching rate between the main layer 25m and the upper layer 25u, the second aperture p2 is larger than the first aperture p1 as viewed from the normal direction of the substrate 11. Stated otherwise, a side face s1 of the first aperture p1 protrudes from a side face s2 of the second aperture p2 into the second contact hole CH2. Therefore, in the second contact portion, the second source electrode 25S has an overhang structure. The side face s1 of the first aperture p1 may be substantially aligned with the side face of the opening 27p in the third dielectric layer 27.

Next, as shown in FIG. 2(c), a conductive film is formed on the third dielectric layer 27, in the first contact holes, and in the second contact hole CH2; the conductive film is patterned; as a result, the first source electrode and the first drain electrode (not shown) and the line 35 are formed. The line 35 is in contact with the source electrode 25S within the second contact hole CH2. In this example, the line 35 is disposed in contact with the upper face of the third dielectric layer 27, the side face of the third dielectric layer 27, and the side face s1 of the upper layer 25u. Thus, on the side wall (tapered portion) of the second contact hole CH2, the line 35 can be formed so as to be directly in contact with the upper layer 25u of the second source electrode 25S.

Figure 9:
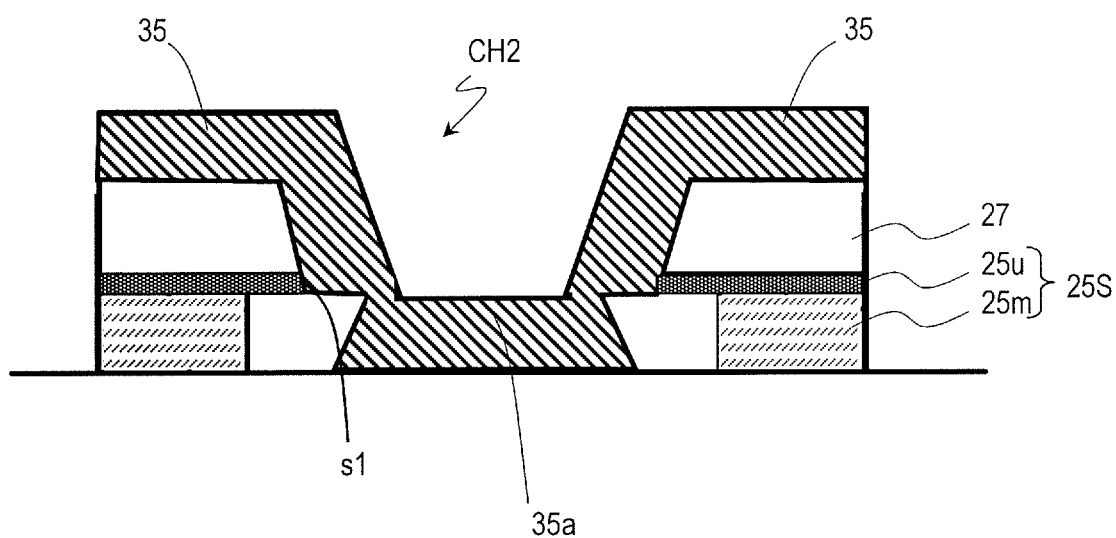
FIG. 9 An enlarged cross-sectional view showing another example of the second contact portion of the semiconductor device according to the first embodiment.

The side face s2 of the main layer 25m may not be in contact with the line 35. Moreover, a portion of the conductive film may be disposed in the second aperture p2 to form the conductive layer 35a. As shown in FIG. 2(c), the conductive layer 35a may be electrically isolated from the line 35. Alternatively, as illustrated in FIG. 9, the conductive layer 35a may be connected to a portion of the conductive film that is located on the side face of the third dielectric layer 27, thus defining a portion of the line 35.

Thus, according to the present embodiment, even if an etching shift due to the HF solution occurs in the second source electrode 25S, the line 35 and the second source electrode 25S can be better connected. On the other hand, in the first contact portion of the crystalline silicon TFT, the ability to clean the silicon surface with an HF solution provides for good contact characteristics.

The active matrix substrate disclosed in Patent Document 1 has a problem of large parasitic capacitance because of the thinness of the dielectric layer (the gate dielectric layer of the pixel TFT) located between the source bus line and the gate bus line. On the other hand, according to the present embodiment, the line 35 functioning as a source bus line is formed on the third dielectric layer 27 (e.g., the planarization layer), whereby the parasitic capacitance between the source bus line and the gate bus line can be reduced.

Next, with reference to the drawings, an example of the method of producing the semiconductor device according to the present embodiment will be described.

FIGS. 3(a) through (f) and FIGS. 4(a) through (d) are step-by-step cross-sectional views showing a method of producing the crystalline silicon TFT 101 and the oxide semiconductor TFT 102.

First, as shown in FIG. 3(a), on a substrate 11 an underlying film 12 is formed, upon which a crystalline silicon film (which herein is a polysilicon (p—Si) film) 13' is formed. As the substrate 11, various substrates can be used, e.g., a glass substrate, a resin plate, or a resin film. Formation of the a-Si film can be achieved by a known method, such as a plasma CVD (Chemical Vapor Deposition) technique or a sputtering technique. Crystallization of the a—Si film may be achieved by irradiating an a—Si film with excimer laser light 104, for example.

Next, as shown in FIG. 3(b), the p—Si film 13' is patterned to form a crystalline silicon semiconductor layer (thickness: e.g. not less than 30 nm and not more than 70 nm) in island shapes on the first TFT forming region. Thereafter, a first insulating layer (thickness: e.g. not less than 50 nm and not more than 130 nm) 14 is formed so as to cover the crystalline silicon semiconductor layer 13. Although there is no particular limitation, the first insulating layer 14 mainly contains silicon oxide (SiOx), for example. The first insulating layer 14 functions as a gate dielectric layer (first gate dielectric layer) of the crystalline silicon TFT 101. Herein, the first dielectric layer 14 is allowed to extend also to the second TFT forming region.

Next, as shown in FIG. 3(c), after an electrode film for the gates (thickness: not less than 200 nm and not more than 500 nm) is formed, it is patterned. This results in the first gate electrode 15 for the crystalline silicon TFT 101, and the second gate electrode 17 for the oxide semiconductor TFT 102. As the material for the electrode film for the gates, without particular limitation, a film containing a metal such as aluminum (Al), tungsten (W), molybdenum (Mo), tantalum (Ta), chromium (Cr), titanium (Ti), or copper (Cu), or an alloy thereof, may be used as appropriate. Moreover, a multilayer film obtained by stacking a plurality of these films may be used. Without particular limitation, any known photolithography and dry etching may be used as the patterning method.

Thereafter, by using the first gate electrode 15 as a mask, an impurity is implanted to the crystalline silicon semiconductor layer 13, thereby forming a source region 13s and a drain region 13d. The region of the crystalline silicon semiconductor layer 13 where the impurity has not been implanted defines an active region (channel region) 13c.

Next, as shown in FIG. 3(d), a second insulating layer (thickness: e.g. not less than 180 nm and not more than 550 nm) 19 covering the first insulating layer 14 and the first gate electrode 15 and second gate electrode 17 is formed. The second dielectric layer 19 functions as a gate dielectric layer (second gate dielectric layer) of the oxide semiconductor TFT 102. As the second dielectric layer 19, for example, a silicon nitride (SiNx) film or a silicon oxide (SiOx) film can be used, although there is no particular limitation. For instance, a multilayer film having a lower layer of a silicon nitride (SiNx) layer (thickness: e.g. not less than 150 nm and not more than 450 nm) and an upper layer of a silicon oxide (SiOx) layer (thickness: e.g. not less than 30 nm and not more than 100 nm) may be used. The second dielectric layer 19 may be allowed to extend also to the first TFT forming region.

Next, as shown in FIG. 3(e), an oxide semiconductor layer 23 is formed on the second dielectric layer 19. Specifically, first, an oxide semiconductor film may be formed e.g. by sputtering technique, and the oxide semiconductor film may be patterned, thus obtaining an island-shaped oxide semiconductor layer 23. As the oxide semiconductor film, for example, an In—Ga—Zn—O based semiconductor film (thickness: e.g. not less than 40 nm and not more than 120 nm) may be used.

Thereafter, as shown in FIG. 3(f), an electrode film for the sources/drains is formed on the second dielectric layer 19 and the oxide semiconductor layer 23 e.g. by sputtering technique. Then, the electrode film for the sources/drains is patterned. As a result, a second source electrode 25S and a second drain electrode 25D that are in contact with the upper face of the oxide semiconductor layer 23 are formed. The portions of the oxide semiconductor layer 23 that are in contact with the second source electrode 25S and the second drain electrode 25D respective become a source contact region 23s and a drain contact region 23d. Any portion of the oxide semiconductor layer 23 that overlaps the gate electrode 17 (via the second dielectric layer 19) and is located between the source contact region 23s and the drain contact region 23d becomes a channel region 23c.

The electrode film for the sources/drains has a multilayer structure including a main layer 25m and an upper layer 25u disposed on the main layer 25m. The main layer 25m may be e.g. a Cu layer, an Al layer, an alloy layer containing Cu or Al, or the like. The materials of the upper layer 25u and the main layer 25m are selected so that the etching rate of the upper layer 25u with respect to an HF solution is smaller than that of the main layer 25m. The upper layer 25u may be e.g. a Ti layer, an Mo layer, an alloy layer containing Ti or Mo, or the like. The electrode film for the sources/drains may have a multilayer structure of three or more layers including the main layer 25m and the upper layer 25u.

The thickness of the upper layer 25u may be e.g. not less than 15 nm and not more than 25 nm. When it is 15 nm or more, an area of contact with the line 35 can be ensured, whereby the contact resistance can be made smaller. When it is 25 nm or less, the electrical resistance can be reduced while keeping the thicknesses of the second source electrode 25S and the second drain electrode 25D small. Although there is no particular limitation, the thickness of the main layer 25m may be larger than the thickness of the upper layer 25u. The thickness of the main layer 25m may be e.g. not less than 100 nm and not more than 500 nm.

Thereafter, as shown in FIG. 4(a), a third dielectric layer 27 is formed in the first and second TFT forming regions. As the third dielectric layer 27, an inorganic dielectric film such as a silicon oxide (SiOx) film, a silicon nitride (SiNx) film, a silicon oxide nitride (SiOxNy; x>y) film, or a silicon nitride oxide (SiNxOy; x>y) film, or an organic dielectric film such as a photosensitive resin film can be used as appropriate. In the case where the third dielectric layer 27 includes a planarization film such as an organic dielectric film, the thickness of the third dielectric layer 27 may be e.g. not less than 1 μm and not more than 3 μm. In this example, in the first TFT forming region, second and third dielectric layers 19 and 27 (corresponding to the dielectric layer 21 shown in FIG. 1) are formed on the first dielectric layer 14.

Next, as shown in FIG. 4(b), in the first TFT forming region, a first source contact hole CH1s through which a portion of the source region 13s is exposed and a first drain contact hole CH1d through which a portion of the drain region 13d is exposed are made in the first dielectric layer 14 and the dielectric layer 21 (first interlevel dielectric layer L1). At the same time, an opening 27p is made in the third dielectric layer 27 (second interlevel dielectric layer L2). The opening 27p exposes a portion of the upper layer 25u of the source electrode 25S.

Thereafter, with an HF solution, the crystalline silicon exposed through the first source contact hole CH1s and the first drain contact hole CH1d is cleaned. In this step, the source electrode 25S exposed through the second contact hole CH2 is also subjected to the HF solution. As a result, as shown in FIG. 4(c), the upper layer 25u and the main layer 25m of the source electrode 25S become etched, whereby a first aperture is created in the upper layer 25u and a second aperture is created in the main layer 25m. Thus, the second contact hole CH2 is obtained. The second contact hole CH2 has a structure which has been described above with reference to FIG. 2(b), for example. Although there is no particular limitation, the conditions for the cleaning process may be, for example: given that the main layer 25m is an Al layer (thickness: 300 nm) and that the upper layer 25u is a Ti layer (thickness: 50 nm), the processing time with the HF solution (concentration: 1%) may be e.g. 15 sec. Moreover, the cleaning agent is not limited to an HF solution, but may be a BHF solution.

Next, as shown in FIG. 4(d), a conductive film is formed on the third dielectric layer 27, and in the first source contact hole CH1s, the first drain contact hole CH1d and the second contact hole CH2, and the conductive film is patterned. As a result, a first source electrode 31 which is in contact with the source region 13s within the first source contact hole CH1s, a first drain electrode 33 which is in contact with the drain region 13d within the first drain contact hole CH1d, and a line 35 which is in contact with the second source electrode 25S within the second contact hole CH2 is formed. The line 35 may be disposed in contact with a side face s1 of the upper layer 25u, within the second contact hole CH2. A portion of the conductive film may be disposed in the second aperture p2 to form a conductive layer 35a which is electrically isolated from the line 35. In this manner, a semiconductor device including the crystalline silicon TFT 101 and the oxide semiconductor TFT 102 is produced.

The structure of and the method of producing the crystalline silicon TFT 101 and the oxide semiconductor TFT 102 are not limited by the structure shown in FIG. 1.

The crystalline silicon TFT 101 may be a bottom gate structure. Moreover, the method of forming the crystalline silicon semiconductor layer, with respect to the method of crystallizing the amorphous silicon film, etc., is not limited to the above, either.

The oxide semiconductor TFT 102 may be a TFT of channel-etch type, or a TFT of etch-stop type. In a channel-etch type TFT, as shown in FIG. 1, no etch stop layer is formed in the channel region, and thus the lower faces of the ends of the source and drain electrodes that are closer to the channel are disposed in contact with the upper face of the oxide semiconductor layer. A channel-etch type TFT is formed by, for example, forming a conductive film for the source/drain electrodes on the oxide semiconductor layer, and effecting source-drain separation. In the source-drain separation step, a surface portion of the channel region may become etched in some cases.

On the other hand, in a TFT having an etch stop layer formed above the channel region (etch-stop type TFT), the lower faces of the ends of the source and drain electrodes that are closer to the channel may be located above the etch stop layer, for example. An etch-stop type TFT is formed by, for example, after forming an etch layer that covers a portion of the oxide semiconductor layer to become a channel region, forming a conductive film for the source/drain electrodes upon the oxide semiconductor layer and the etch stop layer, and effecting source-drain separation.

Furthermore, the oxide semiconductor TFT 102 shown in FIG. 1 has a top-contact structure in which the source and drain electrodes are in contact with the upper face of the oxide semiconductor layer 23, but may alternatively have a bottom-contact structure in which they are in contact with the lower face of the oxide semiconductor layer 23.

In the above method, the first gate electrode 15 and the second gate electrode 17 are made of the same conductive film; however, the first gate electrode 15 of the crystalline silicon TFT 101 and the second source electrode 25S and the second drain electrode 25D of the oxide semiconductor TFT 102 may be made of the same conductive film. In the above method, the first interlevel dielectric layer L1 consists of the first to third dielectric layers 14, 19 and 27 whereas the second interlevel dielectric layer L2 consists of the third dielectric layer 27; however, depending on the TFT structure and the production method, the first interlevel dielectric layer L1 and the second interlevel dielectric layer L2 may differ in construction from the above construction.

The present embodiment is applicable to a construction in which at least one of the first source contact hole and the first drain contact hole of the crystalline silicon TFT 101, and the second contact hole of the oxide semiconductor TFT 102, are simultaneously formed.

Now, the oxide semiconductor layer 23 used in the present embodiment will be described. The oxide semiconductor contained in the oxide semiconductor layer 23 may be an amorphous oxide semiconductor, or a crystalline oxide semiconductor having a crystalline portion. Examples of crystalline oxide semiconductors include polycrystalline oxide semiconductors, microcrystalline oxide semiconductors, crystalline oxide semiconductors whose c axis is oriented essentially perpendicular to the layer plane, and so on.

The oxide semiconductor layer 23 may have a multilayer structure of two or more layers. When the oxide semiconductor layer 23 has a multilayer structure, the oxide semiconductor layer 23 may include an amorphous oxide semiconductor layer and a crystalline oxide semiconductor layer. Alternatively, it may include a plurality of crystalline oxide semiconductor layers of different crystal structures. Moreover, it may include a plurality of amorphous oxide semiconductor layers. In the case where the oxide semiconductor layer 23 has a two-layer structure including an upper layer and a lower layer, the energy gap of the oxide semiconductor that is contained in the upper layer is preferably greater than the energy gap of the oxide semiconductor that is contained in the lower layer. However, when the difference between the energy gaps of these layers is relatively small, the energy gap of the oxide semiconductor of the lower layer may be greater than the energy gap of the oxide semiconductor of the upper layer.

The material, structure, and method of film formation of an amorphous oxide semiconductor and each above crystalline oxide semiconductor, the construction of an oxide semiconductor layer having multilayer structure, etc., are described in Japanese Laid-Open Patent Publication No. 2014-007399, for example. The entire disclosure of Japanese Laid-Open Patent Publication No. 2014-007399 is incorporated herein by reference.

The oxide semiconductor layer 23 may contain at least one metallic element among In, Ga, and Zn, for example. In the present embodiment, the oxide semiconductor layer 23 contains an In—Ga—Zn—O based semiconductor (e.g. indium gallium zinc oxide), for example. Herein, the In—

Ga—Zn—O based semiconductor is a ternary oxide of In (indium), Ga (gallium), Zn (zinc). The ratio between In, Ga, and Zn (composition ratio) is not particularly limited, and includes In:Ga:Zn=2:2:1, In:Ga:Zn=1:1:1, In:Ga:Zn=1:1:2, and the like, for example. Such an oxide semiconductor layer 23 may be made from an oxide semiconductor film containing an In—Ga—Zn—O based semiconductor. Note that a channel-etch type TFT having an active layer including an oxide semiconductor, e.g., an In—Ga—Zn—O based semiconductor, may be referred to as a "CE-OS-TFT".

The In—Ga—Zn—O based semiconductor may be amorphous or crystalline. As the crystalline In—Ga—Zn—O based semiconductor, a crystalline In—Ga—Zn—O based semiconductor whose c axis is oriented essentially perpendicular to the layer plane is preferable.

Note that the crystal structure of a crystalline In—Ga—Zn—O based semiconductor is disclosed in, for example, Japanese Laid-Open Patent Publication No. 2014-007399, supra, Japanese Laid-Open Patent Publication No. 2012-134475, Japanese Laid-Open Patent Publication No. 2014-209727, and so on. The entire disclosures of Japanese Laid-Open Patent Publication No. 2012-134475 and Japanese Laid-Open Patent Publication No. 2014-209727 are incorporated herein by reference. A TFT including an In—Ga—Zn—O based semiconductor layer has a high mobility (20 times that of an a—Si TFT or greater) and a low leakage current (less than 1/100 times that of an a—Si TFT), and therefore is suitably used as a driving TFT (e.g., a TFT that is included in a driving circuit which is provided on the same substrate as the display region, near a display region including a plurality of pixels) or as a pixel TFT (a TFT that is provided in a pixel).

Instead of an In—Ga—Zn—O based semiconductor, the oxide semiconductor layer 23 may contain any other oxide semiconductor. For example, it may contain an In—Sn—Zn—O based semiconductor (e.g. $In_2O_3$—$SnO_2$—ZnO;InSnZn)). An In—Sn—Zn—O based semiconductor is a ternary oxide of In (indium), Sn (tin), and Zn (zinc). Alternatively, the oxide semiconductor layer 23 may contain an In—Al—Zn—O based semiconductor, an In—Al—Sn—Zn—) based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, or the like.

Second Embodiment

A semiconductor device according to a second embodiment differs from the semiconductor device according to the first embodiment (FIG. 1) in that, in the second contact portion of the oxide semiconductor TFT 102, a portion of the main layer 25m of the source electrode 25S is made into a thin film to thereby form a recess p3.

Figure 5:
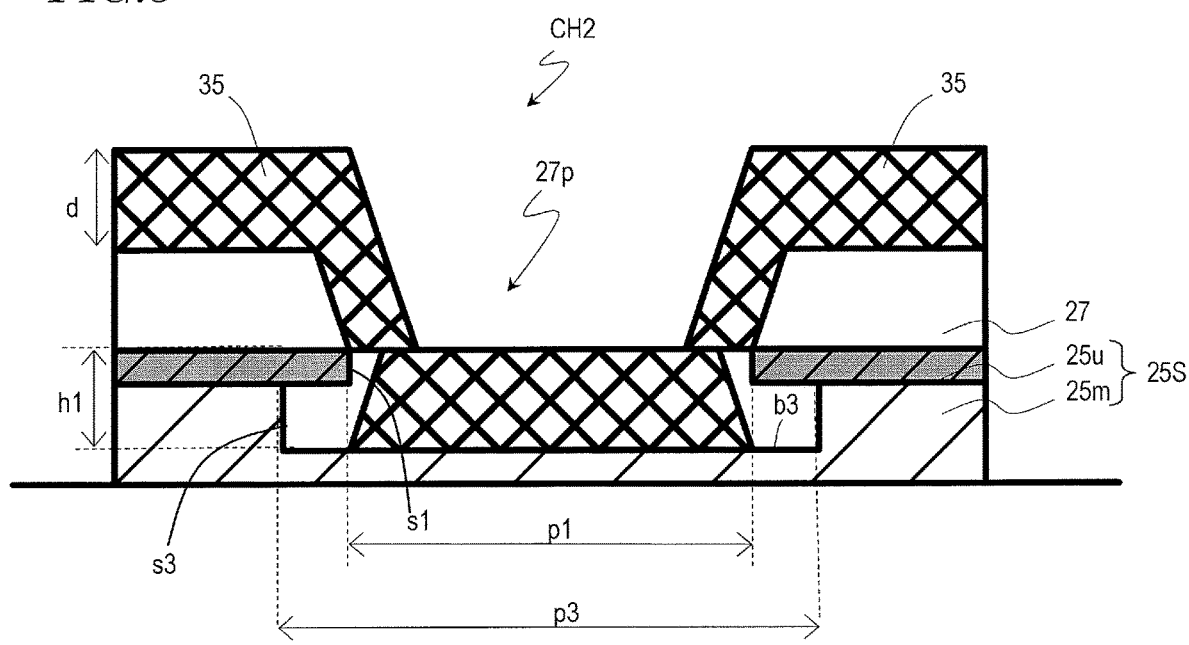
FIG. 5 An enlarged cross-sectional view illustrating an exemplary second contact portion of a semiconductor device according to a second embodiment.

FIG. 5 is an enlarged cross-sectional view of the second contact portion of the semiconductor device according to the present embodiment. Constituent elements similar to those in FIG. 2 are denoted by identical reference numerals. Since the structure other than the second contact portion is identical to that of the semiconductor device according to the first embodiment (FIG. 1), description thereof will be omitted.

In the second contact portion according to the present embodiment, under an opening 27p in the third dielectric layer 27, a first aperture p1 is made in the upper layer 25u of the source electrode 25S, and a recess p3 is made in the main layer 25m. The recess p3 has a side face s3 and a bottom face b3. The second contact hole CH2 consists of the opening 27p, the first aperture p1, and the recess p3. The bottom face b3 of the recess p3 defines the bottom face of the second contact hole CH2. In the present embodiment, too, the upper layer 25u has a smaller etching rate with respect to an HF solution than does the main layer 25m, and therefore, the recess p3 is larger than the first aperture p1 as viewed from the normal direction of the substrate 11. Stated otherwise, the side face s1 of the upper layer 25u protrudes farther into the second contact hole CH2 than does the side face s3 of the recess p3. In the second contact portion, the second source electrode 25S has an overhang structure.

A line 35 is provided on the third dielectric layer 27 and in the second contact hole CH2. The line 35 may be in contact with the main layer 25m, within the second contact hole CH2 and inside the recess p3 of the main layer 25m. In this example, the line 35 is disposed on the third dielectric layer 27, on the side face of the third dielectric layer 27, and on the bottom face b3 of the recess p3. The side face s3 of the recess p3 and the side face s1 of the upper layer 25u may not be directly in contact with the line 35.

The height h1 from the bottom face b3 of the recess p3 to the lower face of the third dielectric layer 27 may be substantially equal to or less than the thickness d of the line 35. As a result of this, the portion of the line 35 that is located on the side face of the third dielectric layer 27 and the portion thereof that is located on the bottom face b3 of the recess p3 are better connected.

The semiconductor device according to the present embodiment may be formed by a method which is similar to the method described above with reference to FIGS. 2 through 4. However, in the present embodiment, in the cleaning step with an HF solution, the upper layer 25u having a relatively large etching rate is subjected to the HF solution first. This reduces the amount of time during which the main layer 25m is subjected to the HF solution, as a result of which a portion of the main layer 25m remains unremoved. In this manner, the recess p3 is formed. This construction is obtained by appropriately selecting the materials and thicknesses of the upper layer 25u and the main layer 25m of the source electrode 25S, the conditions of the HF solution treatment, etc. Thereafter, the line 35 is formed so as to be in contact with at least a portion of the bottom face b3 of the recess p3. Although a portion of the main layer 25m is substantially uniformly made into a thin film in the example shown in the figure, the thickness of the portion that is a made into a thin film may not be uniform.

Figure 6:
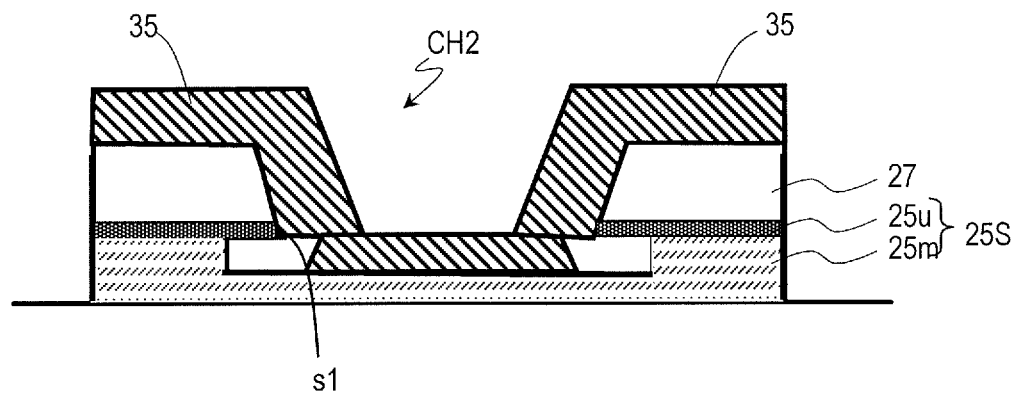
FIGS. 6 (*a*) and (*b*) are enlarged cross-sectional views each showing another example of the second contact portion of the semiconductor device according to the second embodiment.
Figure 6:
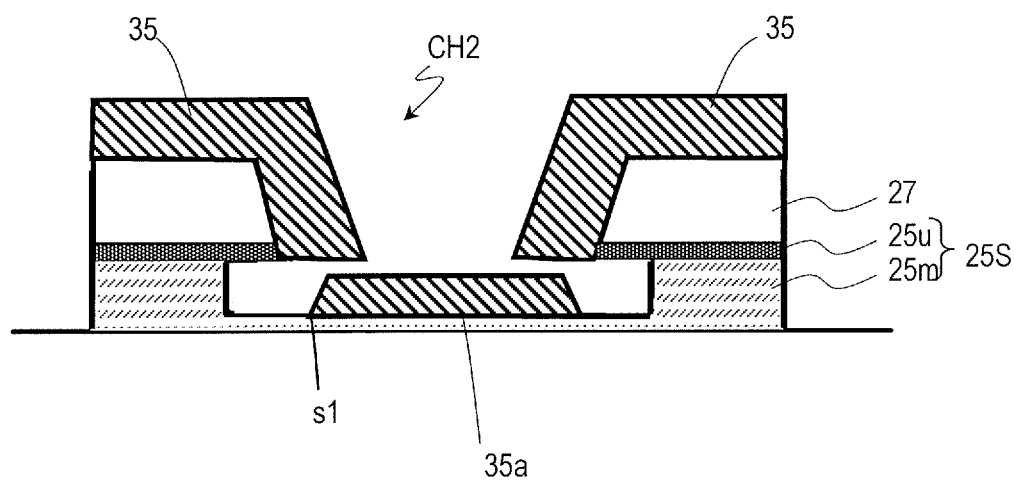

The construction of the second contact portion according to the present embodiment is not limited to the example shown in FIG. 5. As illustrated in FIG. 6(a), the line 35 may be in contact with not only the bottom face b3 of the main layer 25m, but also the side face s1 of the upper layer 25u. Alternatively, as illustrated in FIG. 6(b), the line 35 may be in contact with the side face s1 of the upper layer 25u, without being in contact with the main layer 25m. In this case, a conductive layer 35a which is isolated from the line 35 may be formed in the recess p3.

Third Embodiment

A semiconductor device according to a third embodiment differs from the above embodiments in that the source electrode 25S and the drain electrode 25D have a three-layer structure including an upper layer 25u, a main layer 25m, and a lower layer 25t. In the following description, only differences from the semiconductor device according to the first embodiment (FIG. 1) will be described.

Figure 7:
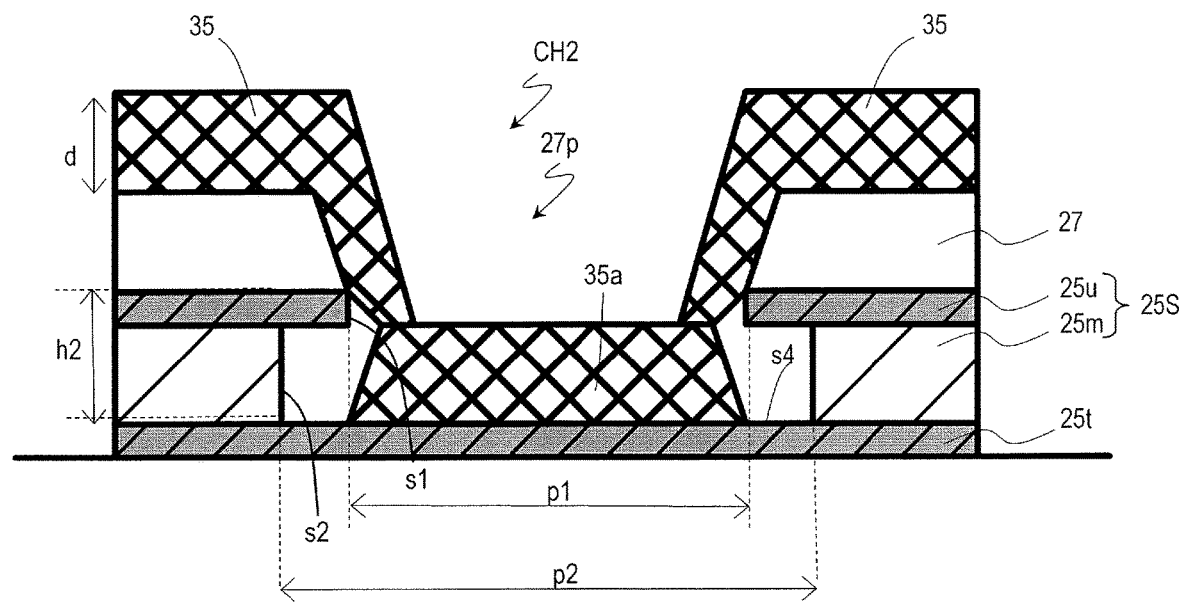
FIG. 7 An enlarged cross-sectional view illustrating an exemplary second contact portion of a semiconductor device according to a third embodiment.

FIG. 7 is an enlarged cross-sectional view of the second contact portion of the semiconductor device according to the present embodiment. Constituent elements similar to those in FIG. 2 are denoted by identical reference numerals.

In the present embodiment, the source electrode 25S and the drain electrode 25D have a three-layer structure including a main layer 25m, an upper layer 25u disposed on the main layer 25m, and a lower layer 25t that is disposed on the substrate 11 side of the main layer 25m. Note that the source electrode 25S and the drain electrode 25D may at least include these three layers; it may have a multilayer structure including four or more layers.

The materials of the upper layer 25u and the lower layer 25t of the source electrode 25S and the drain electrode 25D are selected so that the etching rate of the upper layer 25u and the lower layer 25t with respect to an HF solution is smaller than that of the main layer 25m. The main layer 25m may contain Al, Cu, or an alloy thereof, for example. The upper layer 25u and the lower layer 25t may contain Ti, Mo, or an alloy thereof, for example. The main layer 25m may be made of a material which is lower in electrical resistance than are the upper layer 25u and the lower layer 25t, and be thicker than the upper layer 25u and the lower layer 25t. In this example, an Al layer is used as the main layer 25m, and Ti layers are used as the upper layer 25u and the lower layer 25t. Note that the upper layer 25u and the lower layer 25t may be of respectively different materials.

In the second contact portion according to the present embodiment, under the opening 27p in the third dielectric layer 27, a first aperture p1 is made in the upper layer 25u of the source electrode 25S, and a second aperture p2 is made in the main layer 25m. As viewed from the normal direction of the substrate 11, the second aperture p2 is larger than the upper layer 25u. In other words, the side face s1 of the first aperture p1 protrudes from the side face s2 of the second aperture p2 into the second contact hole CH2. On the other hand, the lower layer 25t remains unremoved. As a result if this, the surface s4 of the lower layer 25t is exposed through the first and second apertures p1 and p2. Note that, in some cases, only a surface portion of the lower layer 25t may have been removed with the HF solution, resulting in a thinner film than any other portion of the lower layer 25t.

Thus, in the present embodiment, the second contact hole CH2 consists of the opening 27p, the first aperture p1, and the second aperture p2, while the surface s4 of the lower layer 25t defines the bottom face of the second contact hole CH2.

Figure 8:
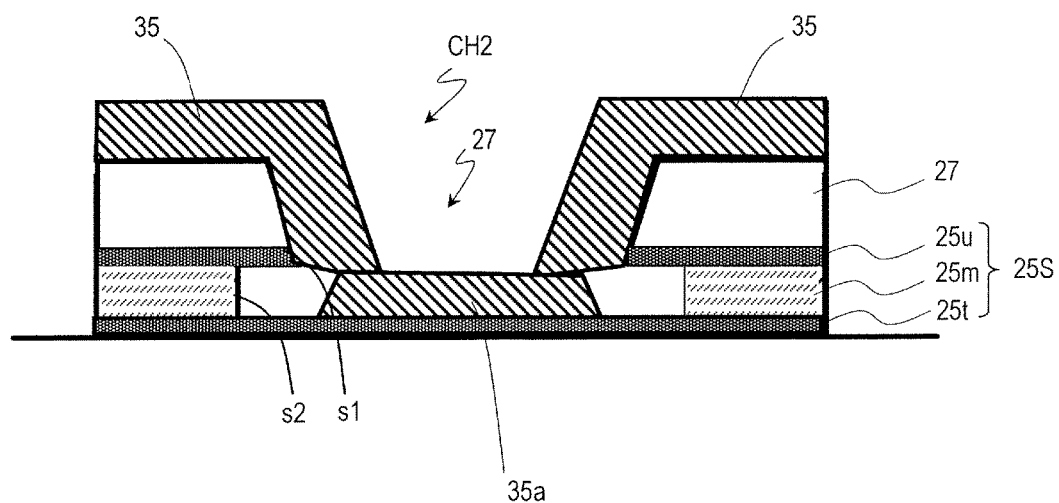
FIG. 8 An enlarged cross-sectional view showing another example of the second contact portion of the semiconductor device according to the third embodiment.

The line 35 is provided on the third dielectric layer 27 and in the second contact hole CH2. The line 35 may be in contact with the exposed surface s4 of the lower layer 25t within the second contact hole CH2. In this example, the line 35 is disposed on the third dielectric layer 27, on the side face of the third dielectric layer 27, and on the exposed surface s4 of the lower layer 25t. The side face s3 of the recess p3 and the side face s1 of the upper layer 25u may not be directly in contact with the line 35. Alternatively, as illustrated in FIG. 8, the line 35 may be also in contact with the side face s1 of the upper layer 25u. The height h2 from the surface s4 of the lower layer 25t to the lower face of the third dielectric layer 27 may be substantially equal to or less than the thickness d of the line 35. As a result of this, the portion of the line 35 that is located on the side face of the third dielectric layer 27 and the portion thereof that is located on the surface s4 of the lower layer 25t are better connected.

The thickness of the upper layer 25u is e.g. not less than 10 nm and not more than 100 nm. The thickness of the lower layer 25t is e.g. not less than 10 nm and not more than 100 nm. When it is 10 nm or more, it better remains in the second contact hole CH2 without being removed by the cleaning step with an HF solution, so that it can be allowed to be in contact with the line 35. When it is 100 nm or less, the electrical resistance can be reduced while keeping the thicknesses of the source electrode 25S and the drain electrode 25D small. Although there is no particular limitation, the thickness of the main layer 25m may be greater than thicknesses of the upper layer 25u and the lower layer 25t. The thickness of the main layer 25m may be e.g. not less than 100 nm and not more than 500 nm.

The second contact portion according to the present embodiment may be formed by a method which is similar to the method described above with reference to FIGS. 2 through 4. However, in the present embodiment, in the cleaning step with an HF solution, the upper layer 25u having a relatively large etching rate is subjected to the HF solution first. This reduces the amount of time during which the lower layer 25t is subjected to the HF solution, as a result of which the lower layer 25t remains unremoved. This construction is obtained by appropriately selecting the materials and thicknesses of the upper layer 25u, the lower layer 25t, and the main layer 25m of the source electrode 25S, the conditions of the HF solution treatment, etc. Thereafter, a line 35 is formed so as to be in contact with at least a portion of the exposed surface s4 of the lower layer 25t.

Figure 10:
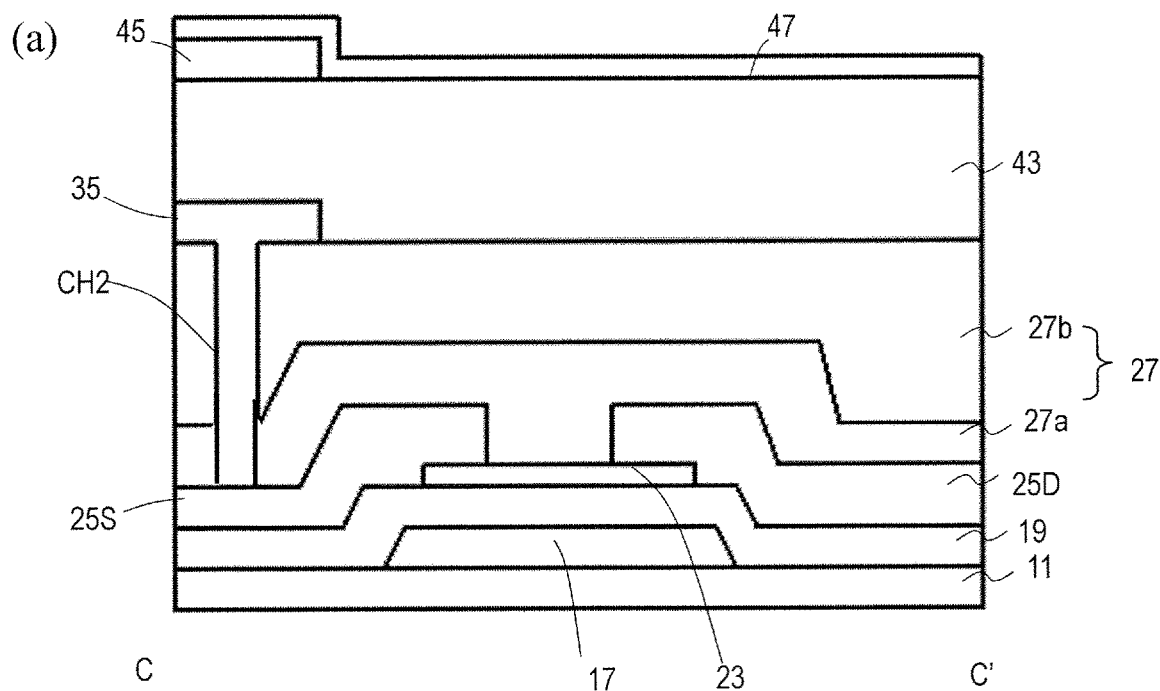
FIGS. 10 (*a*) and (*b*) are a cross-sectional view and a plan view, respectively, illustrating a portion of a display region of an exemplary active matrix substrate for an in-cell touch-screen type display device.
Figure 10:
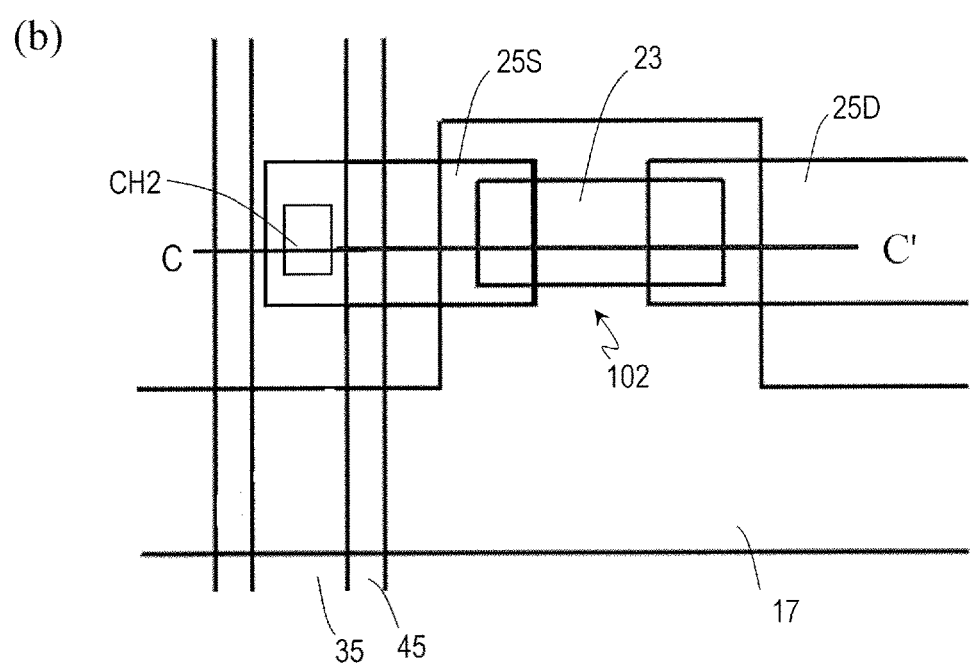

The above-described first to third embodiments are suitably applicable to an active matrix substrate, for example. In an active matrix substrate, the crystalline silicon TFT 101 may be used as a circuit TFT composing driving circuitry, and the oxide semiconductor TFT 102 may be used as a pixel TFT provided for each pixel. In this case, the line 35 to be connected to the source electrode 25S of the oxide semiconductor TFT 102 would be a source bus line. On the other hand, the drain electrode 25D of the oxide semiconductor TFT 102 would be connected to a pixel electrode not shown. The first to third embodiments are particularly suitably applicable to an active matrix substrate of an in-cell touch-screen type display device. In this case, driving lines (lines for the driving electrodes or lines for the detection electrode) of the touch-screen panel could also be formed by using the same conductor film as the source bus line (line 35). Alternatively, as shown in FIGS. 10(a) and (b), via an organic dielectric film 43, a driving line 45 and a touch-screen electrode 47 of the touch-screen panel may be provided on the line (source bus line) 35. In this example, in the second contact portion, the line 35 is connected to the source electrode 25S within the contact hole CH2 made in a third dielectric layer 27 which includes an inorganic dielectric film 27a and an organic dielectric film 27b. Although omitted from illustration, this second contact portion may have any of the structures described above with reference to FIG. 1 and FIGS. 5 through 9. In in-cell touch-screen type display devices, for the sake of sensing by the touch-screen panel and for pixel writes, there is a need to shorten the write time to the pixels. By applying the above embodiments and providing the source bus lines on a planarization layer, the parasitic capacitances between source bus lines and the gate bus lines can be reduced, whereby the write time to the pixels can be shortened.

INDUSTRIAL APPLICABILITY

Embodiments of the present invention are broadly applicable to devices or electronic appliances including a plurality of thin film transistors. For example, they are applicable to circuit boards such as active matrix substrates; display devices such as liquid crystal display devices, organic electroluminescence(EL) display devices, and inorganic electroluminescence display devices; imaging devices such as radiation detectors and image sensors; electronic devices such as image input devices and fingerprint reader devices; and the like.

REFERENCE SIGNS LIST

11: substrate
12: underlying film
13: crystalline silicon semiconductor layer
14: first dielectric layer
15: first gate electrode
17: second gate electrode
19: second dielectric layer
21: dielectric layer
23: oxide semiconductor layer
25D: second drain electrode
25S: second source electrode
25u: upper layer
25m: main layer
25t: lower layer
27: third dielectric layer
27p: opening
31: first source electrode
33: first drain electrode
35: line
35a: conductive layer
101: crystalline silicon TFT
102: oxide semiconductor TFT
CH1d: first drain contact hole
CH1s: first source contact hole
CH2: second contact hole
p1: first aperture
p2: second aperture
p3: recess

The invention claimed is:

1. A semiconductor device comprising: a substrate; and a first thin film transistor and a second thin film transistor supported on the substrate, wherein,
the first thin film transistor includes a first gate electrode, a crystalline silicon semiconductor layer, a first gate dielectric layer interposed between the first gate electrode and the crystalline silicon semiconductor layer, and a first source electrode and a first drain electrode electrically connected to the crystalline silicon semiconductor layer;
the second thin film transistor includes a second gate electrode, an oxide semiconductor layer, a second gate dielectric layer interposed between the second gate electrode and the oxide semiconductor layer, and a second source electrode and a second drain electrode electrically connected to the oxide semiconductor layer;
the first source electrode and the first drain electrode are provided on the crystalline silicon semiconductor layer via a first interlevel dielectric layer, and are in contact with the crystalline silicon semiconductor layer respectively within a first source contact hole and a first drain contact hole made in the first interlevel dielectric layer;
the second source electrode is electrically connected to a line which is made of a same conductive film as the first source electrode and the first drain electrode;
the line is provided on the second source electrode via a second interlevel dielectric layer, and is in contact with the second source electrode within a second contact hole, the second contact hole including an opening made in the second interlevel dielectric layer; and
the second source electrode has a multilayer structure including a main layer and an upper layer disposed on the main layer, wherein under the opening in the second interlevel dielectric layer the upper layer has a first aperture and the main layer has a second aperture or a recess, the second aperture or recess being larger than the first aperture as viewed from a normal direction of the substrate.

2. The semiconductor device of claim 1, wherein a side face of the second aperture or recess of the main layer is not in contact with the line.

3. The semiconductor device of claim 1 or 2, wherein the line is in contact with a side face of the first aperture of the upper layer.

4. The semiconductor device of claim 3, further including a conductive layer made of the conductive film, the conductive layer being located in the second aperture or recess and being electrically isolated from the line.

5. The semiconductor device of claim 1, wherein,
the main layer has the recess, such that at least a portion of a bottom face of the recess is exposed through the first aperture of the upper layer; and
the line is in contact with the bottom face of the recess within the second contact hole.

6. The semiconductor device of claim 1, wherein,
the second source electrode further includes a lower layer located on the substrate side of the main layer;
the main layer has the second aperture, such that a portion of the lower layer is exposed through the second aperture; and
the line is in contact with the exposed portion of the lower layer within the second contact hole.

7. The semiconductor device of claim 5, wherein a side face of the first aperture of the upper layer is not in contact with the line.

8. The semiconductor device of claim 1, wherein the upper layer is made of a material having a smaller etching rate with respect to hydrofluoric acid than that of the main layer.

9. The semiconductor device of claim 1, wherein the main layer contains Al or Cu.

10. The semiconductor device of claim 1, wherein the upper layer contains Ti or Mo.

11. The semiconductor device of claim 1, wherein,
the first thin film transistor has a top gate structure, and the second thin film transistor has a bottom gate structure, the first gate electrode and the second gate electrode being provided in same layer; and
the first interlevel dielectric layer includes the first gate dielectric layer, the second gate dielectric layer, and the second interlevel dielectric layer.

12. The semiconductor device of claim 1, wherein the oxide semiconductor layer comprises an In—Ga—Zn—O based semiconductor.

13. The semiconductor device of claim 12, wherein the In—Ga—Zn—O based semiconductor includes a crystalline portion.

14. The semiconductor device of claim 1, wherein the oxide semiconductor layer has a multilayer structure.

15. The semiconductor device of claim 1, wherein the second thin film transistor is of a channel-etch type.

16. A method of producing a semiconductor device including, on a substrate: a first thin film transistor having an active layer which is a crystalline silicon semiconductor layer; and a second thin film transistor having an active layer which is an oxide semiconductor layer, the first thin film transistor being disposed in a first TFT forming region and the second thin film transistor being disposed in a second TFT forming region, the method comprising:

(A) a step of providing a substrate, including: in the first TFT forming region, the crystalline silicon semiconductor layer and a first interlevel dielectric layer covering the crystalline silicon semiconductor layer; and, in the second TFT forming region, a source electrode and a drain electrode of the second thin film transistor, and a second interlevel dielectric layer covering the source electrode and the drain electrode, the source electrode and the drain electrode having a multilayer structure including a main layer and an upper layer on the main layer, the upper layer having a smaller etching rate with respect to hydrofluoric acid than that of the main layer;

(B) a step of making a first source contact hole and a first drain contact hole in the first interlevel dielectric layer, the first source contact hole and the first drain contact hole reaching the crystalline silicon semiconductor layer, and an opening in the second interlevel dielectric layer, the opening reaching the source electrode;

(C) a step of cleaning a surface of the crystalline silicon semiconductor layer exposed through the first source contact hole and the first drain contact hole with a cleaning agent containing hydrofluoric acid, wherein, as a result of the upper layer and the main layer of the source electrode being etched with the cleaning agent, under the opening in the second interlevel dielectric layer, a first aperture is made in the upper layer and a second aperture or a recess is made in the main layer, thus forming a second contact hole which includes the opening, the first aperture, and the second aperture or recess; and (D) a step of forming, on the second interlevel dielectric layer and in the second contact hole, a line which is in contact with the source electrode within the second contact hole.

17. The method of producing a semiconductor device of claim 16, wherein, as viewed from the normal direction of the substrate, the second aperture or recess is larger than the first aperture.

18. The method of producing a semiconductor device of claim 16, wherein the oxide semiconductor layer comprises an In—Ga—Zn—O based semiconductor.

19. The semiconductor device of claim 1, further including a driving line for an in-cell touch-screen panel, the driving line for an in-cell touch-screen panel being made of a same conductor film as the line.

20. An in-cell touch-screen type display device comprising the semiconductor device of claim 19.

* * * * *